(12) United States Patent
Nam et al.

(10) Patent No.: US 7,692,995 B2
(45) Date of Patent: Apr. 6, 2010

(54) REDUNDANCY PROGRAM CIRCUIT AND METHODS THEREOF

(75) Inventors: Jeong-Sik Nam, Seoul (KR);
Sang-Kyun Park, Suwon-si (KR);
Kwang-Hyun Kim, Seoul (KR);
Byung-Sik Moon, Seoul (KR);
Won-Chang Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 45 days.

(21) Appl. No.: 12/314,970

(22) Filed: Dec. 19, 2008

(65) Prior Publication Data
US 2009/0116327 A1  May 7, 2009

Related U.S. Application Data

(62) Division of application No. 11/978,579, filed on Oct. 30, 2007, now Pat. No. 7,477,565, which is a division of application No. 11/169,831, filed on Jun. 30, 2005, now Pat. No. 7,307,910.

(30) Foreign Application Priority Data

Jun. 30, 2004  (KR) ................... 2004-50226
Sep. 10, 2004  (KR) ................... 2004-72371

(51) Int. Cl.
*G11C 17/18* (2006.01)
(52) U.S. Cl. ................. 365/225.7; 365/200
(58) Field of Classification Search ............ 365/225.7, 365/200
See application file for complete search history.

(56) References Cited

U.S. PATENT DOCUMENTS

| | | | |
|---|---|---|---|
| 4,601,031 A | 7/1986 | Walker et al. | |
| 5,258,953 A | 11/1993 | Tsujimoto | |
| 5,287,310 A | 2/1994 | Schreck et al. | |
| 5,319,592 A * | 6/1994 | Nguyen | 365/225.7 |
| 5,404,331 A | 4/1995 | McClure | |
| 5,452,258 A | 9/1995 | Hotta | |
| 5,461,587 A | 10/1995 | Oh | |
| 5,502,676 A | 3/1996 | Pelley et al. | |
| 5,555,212 A | 9/1996 | Toshiaki et al. | |
| 5,621,691 A | 4/1997 | Park | |
| 5,689,465 A * | 11/1997 | Sukegawa et al. | 365/200 |
| 5,747,869 A | 5/1998 | Prall et al. | |
| 5,808,944 A * | 9/1998 | Yoshitake et al. | 365/200 |
| 5,848,003 A | 12/1998 | Nishikawa | |
| 5,933,382 A | 8/1999 | Yi et al. | |
| 6,067,262 A | 5/2000 | Iminki et al. | |
| 6,118,712 A * | 9/2000 | Park et al. | 365/225.7 |
| 6,320,801 B1 | 11/2001 | Kwak | |

(Continued)

*Primary Examiner*—Tuan T. Nguyen
(74) *Attorney, Agent, or Firm*—Harness, Dickey, & Pierce, P.L.C.

(57) ABSTRACT

A redundancy program circuit and methods thereof. The redundancy program circuit may include a master fuse circuit with a master fuse outputting an operation enable signal to indicate a master fuse operating status, at least one control fuse circuit including at least one control fuse, the at least one control fuse circuit outputting an operating status signal for the at least one control fuse and a multiplexing unit configured to multiplex decoding address signal bits based on at least one of the operating status signal and the operation enable signal.

2 Claims, 19 Drawing Sheets

U.S. PATENT DOCUMENTS

| | | | |
|---|---|---|---|
| 6,392,938 B1 * | 5/2002 | Choi et al. .................. 365/200 |
| 6,426,902 B1 * | 7/2002 | Lee et al. ................... 365/200 |
| 6,704,228 B2 * | 3/2004 | Jang et al. .................. 365/200 |
| 6,768,694 B2 * | 7/2004 | Anand et al. ............. 365/225.7 |
| 6,785,171 B2 | 8/2004 | Lee et al. |
| 6,882,585 B2 * | 4/2005 | Cho et al. ................... 365/200 |
| 6,928,008 B2 * | 8/2005 | Lee et al. .................... 365/200 |
| 7,154,791 B2 * | 12/2006 | Kim .......................... 365/200 |
| 7,280,415 B2 * | 10/2007 | Hwang et al. .......... 365/189.09 |
| 7,336,549 B2 * | 2/2008 | Min et al. ................... 365/200 |
| 2002/0093860 A1 | 7/2002 | Kato et al. |
| 2004/0032766 A1 | 2/2004 | Lee et al. |
| 2008/0068905 A1 * | 3/2008 | Kim .......................... 365/200 |

\* cited by examiner

REDUNDANCY PROGRAM CIRCUIT AND METHODS THEREOF

PRIORITY STATEMENT

This U.S. patent application is a divisional of Ser. No. 11/978,579, filed Oct. 30, 2007, now U.S. Pat. No. 7,477,565 which is a divisional of U.S. patent application Ser. No. 11/169,831 filed Jun. 30, 2005 now U.S. Pat. No. 7,307,910 which claims priority under 35 U.S.C. §119 of Korean Patent Applications 2004-50226 filed on Jun. 30, 2004 and 2004-72371 filed on Sep. 10, 2004, the entire contents of each of which are hereby incorporated by reference.

BACKGROUND OF THE INVENTION

1. Field of the Invention

The present invention relates generally to a semiconductor device and methods thereof, and more particularly, to a redundancy program circuit and methods thereof.

2. Description of Related Art

A fabrication of a semiconductor device (e.g., a semiconductor memory device) may include various tests (e.g., of chips or memory devices on a wafer) to verify a correct function of the semiconductor device. For example, such tests may verify whether circuit devices in the semiconductor device may operate in conformity with a given specification or protocol. In an example test, a plurality of test parameters may be used to check electrical characteristics and/or an operation of a tested semiconductor device. If the given test indicates an incorrect operation of the tested semiconductor device (e.g., because the electrical characteristics and/or the operation of the semiconductor may not be proper), a debugging of the semiconductor device may not be possible.

However, in an example where the semiconductor device may include a defective memory cell within a memory cell array, a repair process (e.g., debugging process) may be executed which may replace the defective memory cell with a redundancy memory cell. In other words, if a portion of the memory cells in the semiconductor device are defective, the defective portion of the memory cells may be replaced with at least one spare memory cell manufactured redundantly, which may thereby enable the semiconductor device to operate correctly.

A redundancy program circuit, which may be alternatively referred to as a fuse box or spare circuit, may be employed to achieve the above described debugging or defective memory cell replacement process. The redundancy program circuit may employ a process which may include melting fuses (e.g., with a high energy light, a laser, etc.), as will be described below in greater detail with reference to FIG. 1.

FIG. 1 illustrates a block diagram of a conventional semiconductor device 107. The conventional semiconductor device 107 may include a memory cell array 40 having a normal memory cell array 41 and a spare memory cell array 42. The normal memory cell array 41 and the spare memory cell array 42 may be connected to row decoders 20, 21, 22, 23, a spare row decoder 25, column decoders 30 and 31 and a spare column decoder 35. Row decoders 20, 21, 22 and 23 and column decoders 30 and 31 may be associated with the normal memory cell array 41, and the spare row decoder 25 and the spare column decoder 35 may be associated with the spare memory cell array 42.

FIG. 1, a conventional redundancy operation may be performed by a row spare circuit 10 and/or a column spare circuit 11, which may collectively function as the above-described redundancy program circuit. The row spare circuit 10 may receive a pre-decoded row address DRAi from a row predecoder 6 and may generate a row redundancy enable signal X-RENi. The row redundancy enable signal X-RBNi may be received by the spare row decoder 25, which may perform a debug in a row direction based on the received row redundancy enable signal X-RENi. Likewise, the column spare circuit 11 may receive a pre-decoded column address DCAi of a column predecoder 7 and may generate a column redundancy enable signal Y-RENi. The column redundancy enable signal Y-RENi may be applied to the spare column decoder 35, which may perform a debug in a column direction based on the received column redundancy enable signal Y-RENi.

FIG. 2 illustrates an applied path of a decoding address applied to the row/column spare circuits 10/11 in the semiconductor device 107 of FIG. 1. For example, if a 7-bit external address EADDi is applied to an address buffer 2, row and column internal address generators 4/5 may each generate an applied bit signal and a complementary signal, the complementary signal inverted from a logic level of corresponding bits of the 7-bit external address EADDi, to generate a 14-bit internal addresses IRAi and ICAi.

The row/column internal address generators 4/5 may be integrated such that an internal address (e.g., a row or column address) may be generated. The row/column predecoder 6/7 may predecode the internal address and may generate, for example, a predecoded address having 16 bits (e.g., DA01 4 bit+DA234 8 bit+DA56 4 bit). The row decoder 20 may decode the predecoded row address DRAi and may select a given word line from among the word lines WL0:n of the normal memory cell array 41 and the row spare circuit 10 may generate a row redundancy enable signal X-RENi for replacing a given row of a defective memory cell in response to the predecoded row address DRAi.

Similarly, the column decoder 30 may decode the predecoded column address DCAi, and may select a given column selection line from among a plurality of column selection lines of the normal memory cell array 41. The column spare circuit 11 may generate a column redundancy enable signal Y-RENi for replacing a given column of a defected memory cell in response to the predecoded column address DCAi.

Referring to FIG. 2, lines of predecoded addresses applied to the decoders 20/30 and the row/column spare circuits 10/11 may be divided into lines L1, L2 and L3. If a circuit (e.g., spare circuit 10, spare circuit 11, etc.) with a decoder includes a NAND gate and an inverter, NMOS transistors within the NAND gate may be influenced by a body effect. The body effect may cause the circuit to be unstable.

FIG. 3 illustrates the conventional row/column spare circuit 10/11 of FIG. 1. The row/column spare circuit 10/11 may include a master fuse circuit (MFC), NMOS transistors N1-N16, a plurality of fuses F1-F16, operating enable transistors M1/M2/M3 and an AND gate AND1. A master fuse MF may be included within the master fuse circuit MFC. The fuses F1-F16 may store addresses of a defective memory cell in order to perform a redundancy operation. In an example, the fuses F1-F16 may include a silicon material (e.g., polysilicon). The fuses F1-F16 may be cut (e.g., melted, cut, opened by a high energy light such as a laser, etc.). The fuses F1-F16 may be disposed in a peripheral circuit region on a chip (e.g., row/column spare circuit 10/11).

If the normal memory cell array 41 includes a defective memory cell and a row and/or column address for designating the defective memory cell is applied (e.g., during operation), the row spare circuit 10 and/or column spare circuit 11 may output a redundancy enable signal RENi to disable a row and/or column of the defective memory cell and may enable a row or column of a redundant memory cell (e.g., based on a cutting of the fuses F1-F16). In an example, referring to FIG. 3, if a memory cell corresponding to an external address "0000000" is determined to be defective (e.g., in a test process), master fuses MF and fuses F2-F4, F6-F12 and F14-F16 may be cut or blown by a fuse cutting or blowing process. Fuses F1, F5 and F13 may not be cut. A redundancy enable signal RENi may be outputted from an AND gate AND1 at a first logic level (e.g., a higher logic level, a lower logic level, etc.) when the external address is applied as "0000000".

If a normal disable signal at a second logic level (e.g., a lower logic level, a higher logic level, etc.) is applied to the row/column decoder 20/30, the row/column decoder 20/30 may disable a corresponding normal row or normal column. A row or column of a defective memory cell may be set at an inoperable state (e.g., not capable of a reading or writing to/from the memory). The redundancy enable signal RENi may also be applied to a spare row/column decoder 25/35. A row or column of the spare memory cell may be enabled and the defective memory cell may be replaced with a redundant spare memory cell.

In other words, a defective memory cell may be replaced by cutting or blowing a master fuse among fuses MF and F1-F16 in the row/column spare circuits 10/11 and a fuse corresponding to an address bit of the defective memory cell.

In the above-described conventional redundancy program operation, a manufacturing yield of semiconductor devices may be increased by repairing a defective memory cell. However, a chip size and a duration of the redundancy program operation may scale with a number of fuses. For example, if the conventional semiconductor device 107 requires additional memory, it may also require additional fuses for the redundancy program operation (e.g., because more bits may be needed to address the additional memory), thereby requiring a larger chip size which may reduce a yield of the semiconductor device 107 and induce a longer duration for each defective memory cell replacement (e.g., because multiple fuses may be cut/blown), thereby reducing a speed of operation.

Further, the fuses F1-F16 of FIG. 3 may be disposed corresponding to address bits before decoding (e.g., one fuse may be associated with each predecoded address bit). By disposing fuses F1-F16 as corresponding to address bits prior to decoding, a number of fuses in the semiconductor device 107 may be reduced. However, the disposition of the fuses F1-F16 in FIG. 3 may require that address lines be independently added (e.g., the address lines may not be shared), which may increase a complexity of the conventional semiconductor device 107.

SUMMARY OF THE INVENTION

An example embodiment of the present invention is directed to a redundancy program circuit, including a master fuse circuit including a master fuse outputting an operation enable signal to indicate a master fuse operating status, at least one control fuse circuit including at least one control fuse, the at least one control fuse circuit outputting an operating status signal for the at least one control fuse and a multiplexing unit configured to multiplex decoding address signal bits based on at least one of the operating status signal and the operation enable signal.

Another example embodiment of the present invention is direct to a redundancy program circuit, including a master fuse circuit including a master fuse generating an operation enable signal indicating an operating status of the master fuse, a first fuse box circuit including first program fuses disposed so as to correspond to signal bits of a decoding address and generating a first fuse box output signal in response to the operation enable signal, a second fuse box circuit including second program fuses disposed so as to correspond to signal bits of an internal address and generating a second fuse box output signal in response to the operation enable signal and a gating circuit for gating the first and second fuse box output signals and generating a redundancy enable signal.

Another example embodiment of the present invention is directed to a method of performing a redundancy program operation, including generating an operation enable signal, generating at least one control signal pair, selectively outputting logic levels of at least a portion of a decoding address based at least in part on a first of the at least one control signal pair and multiplexing the selectively outputted logic levels to attain a redundancy enable signal based at least in part on the at least one control signal pair.

Another example embodiment of the present invention is directed to a method of performing a redundancy program operation, including generating an operation enable signal, generating a first fuse box output signal based on whether the operation enable signal is activated, generating a second fuse box output signal at a program fuse disposed so as to correspond to signal bits of an internal address generated before an applied external address is decoded and gating the first and second fuse box output signals to generate a redundancy enable signal.

Another example embodiment of the present invention is directed to a method of reducing the number of fuses used for a redundancy program operation, including allocating a first portion of fuses corresponding to signal bits of a decoding address and allocating a second portion of fuses corresponding to signal bits of an internal address.

Another example embodiment of the present invention is directed to a redundancy program circuit, including a master fuse circuit including a master fuse outputting an operation enable signal to indicate a master fuse operating status, at least one control fuse circuit including at least one control fuse, the at least one control fuse circuit outputting an operating status signal for the at least one control fuse and a decoding circuit for decoding signal bits of a decoding address in response to the operating status signal and transferring a given logic level along with the decoding address to a decoding output terminal.

Another example embodiment of the present invention is directed to a method of performing a redundancy program operation, including generating an operation enable signal, generating an operating status signal indicating a status of at least one control fuse and decoding signal bits of a decoding address in response to the operating status signal and transferring a given logic level associated with a defective memory cell along with the decoding address to a decoding output terminal.

BRIEF DESCRIPTION OF THE DRAWINGS

The accompanying drawings are included to provide a further understanding of example embodiments of the invention, and are incorporated in and constitute a part of this specification. The drawings illustrate example embodiments of the present invention and, together with the description, serve to explain principles of the present invention. In the drawings.

DETAILED DESCRIPTION OF EXAMPLE EMBODIMENTS OF THE PRESENT INVENTION

Figure 1:
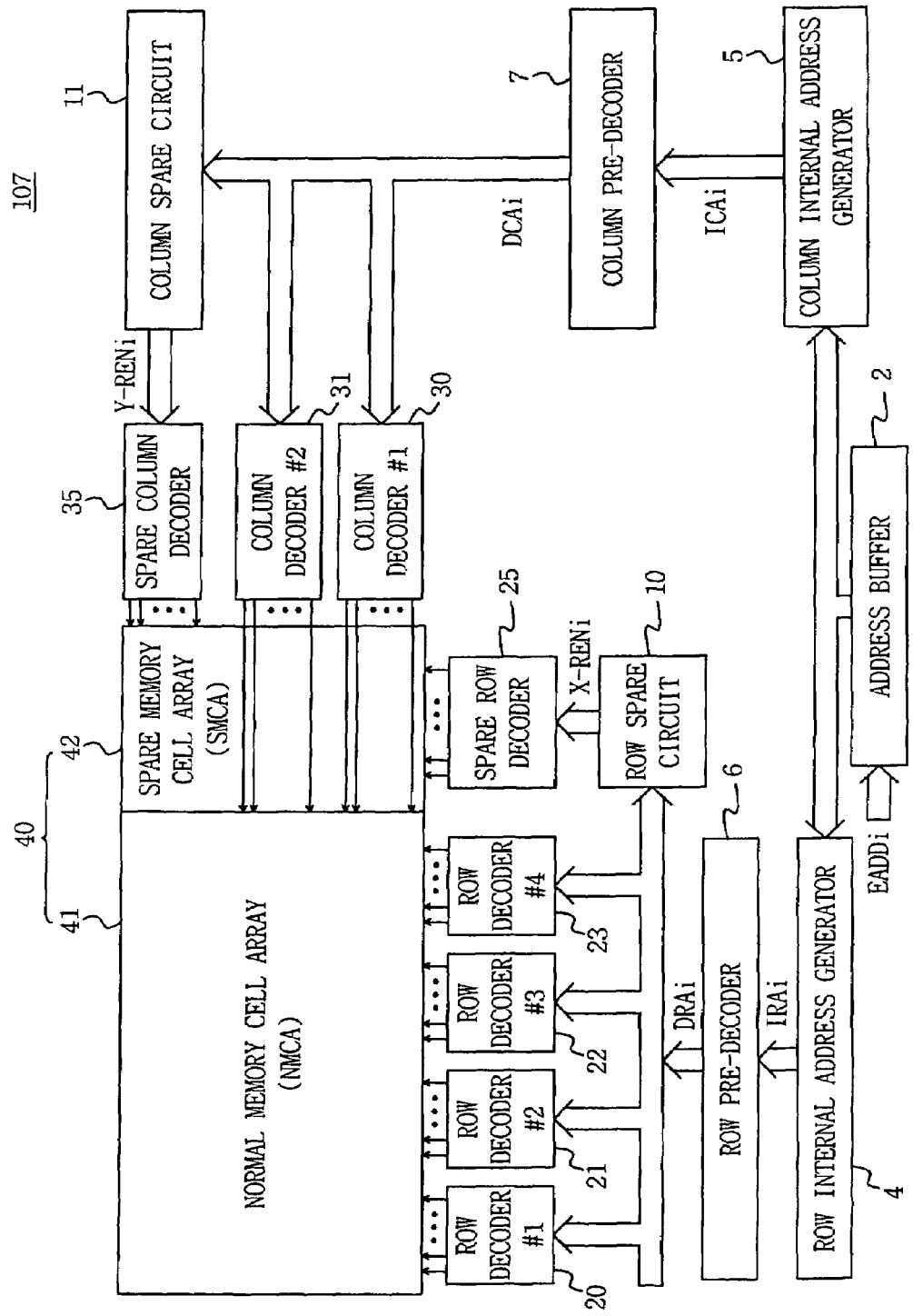
FIG. 1 illustrates a block diagram of a conventional semiconductor device.
Figure 2:
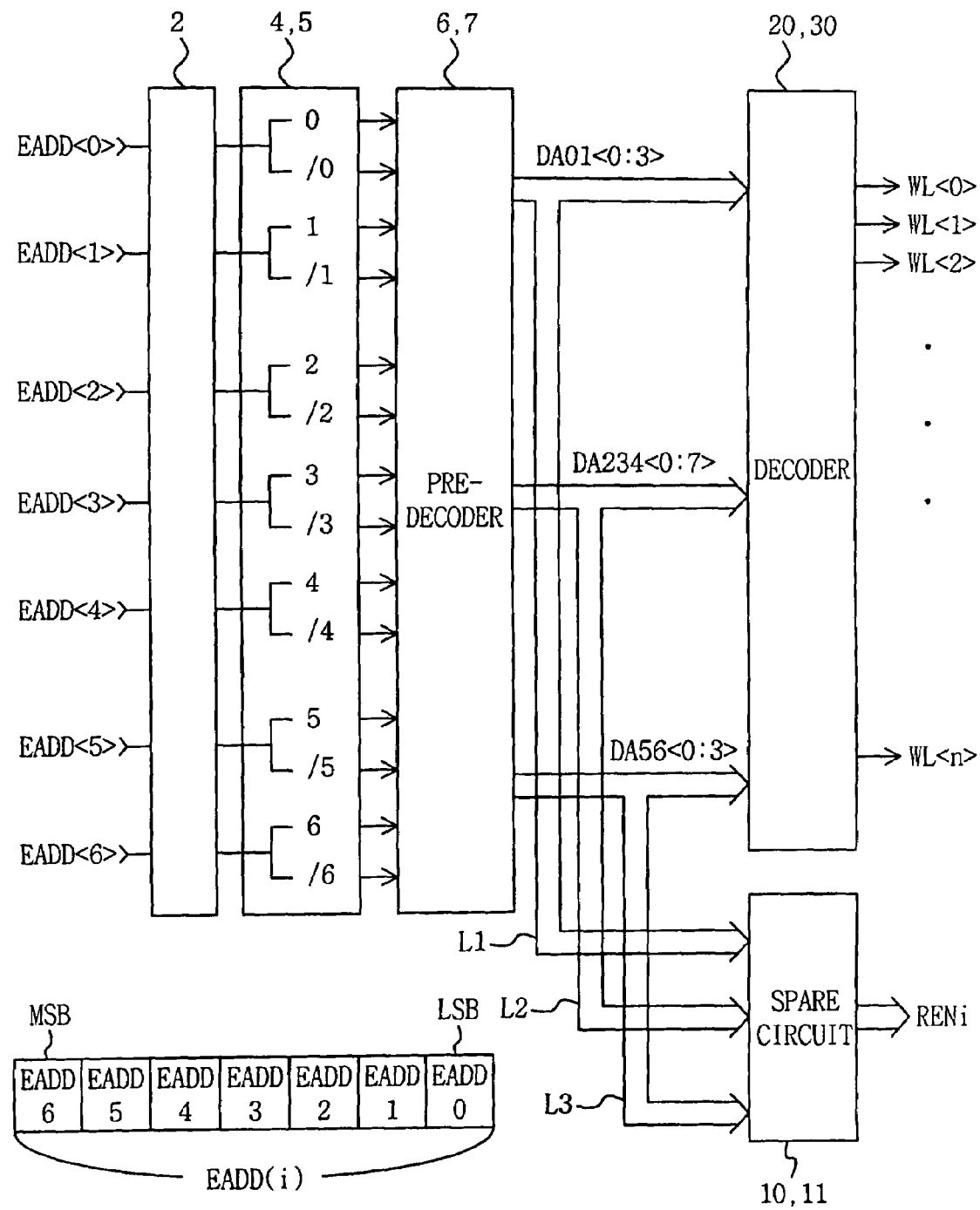
FIG. 2 illustrates an applied path of a decoding address applied to the row/column spare circuits 10/11 in the conventional semiconductor device of FIG. 1.
Figure 3:
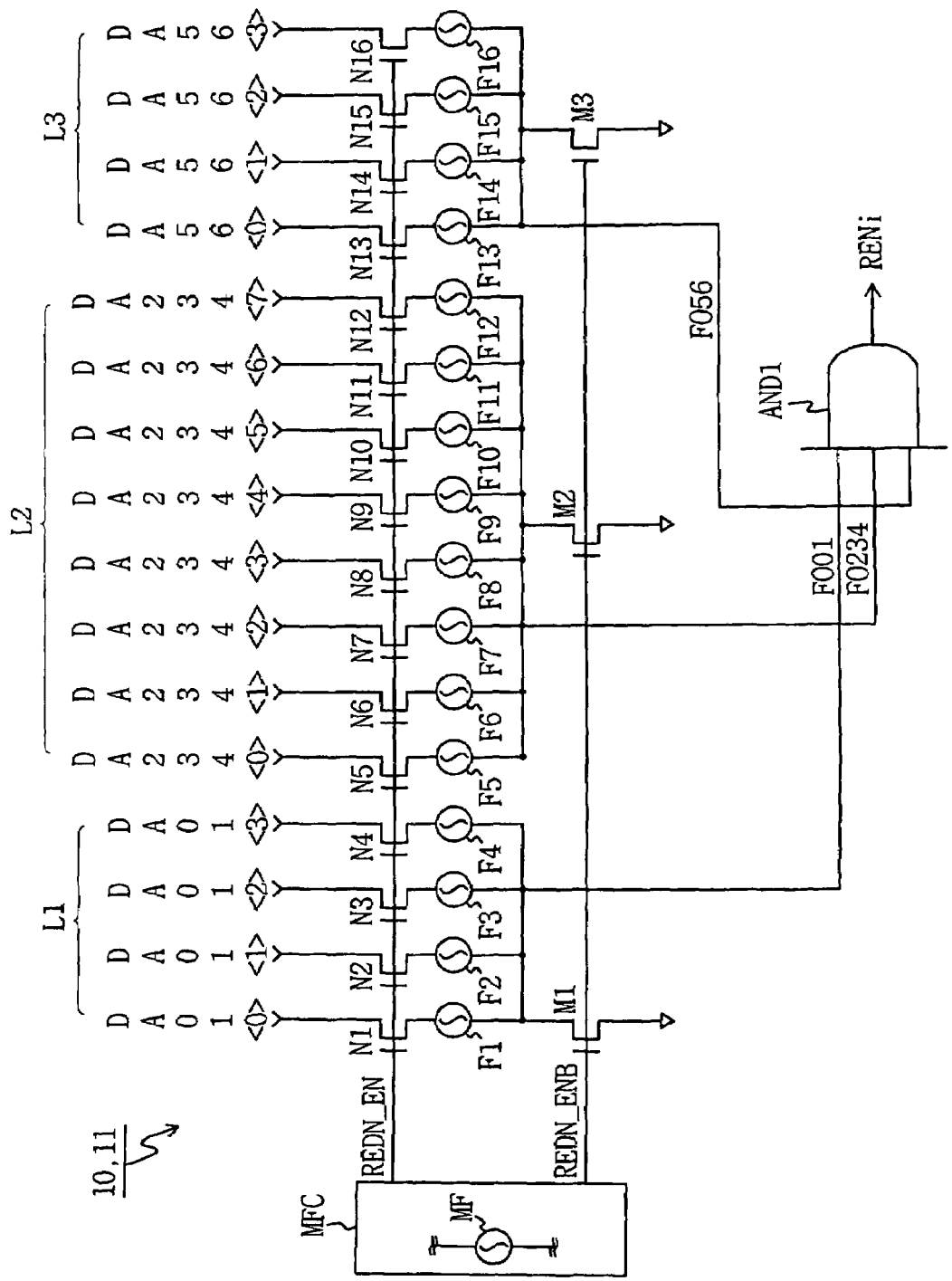
FIG. 3 illustrates a conventional row/column spare circuit.

Hereinafter, example embodiments of the present invention will be described in detail with reference to the accompanying drawings.

In the Figures, the same reference numerals are used to denote the same elements throughout the drawings. However, a number of transistors (e.g., NMOS transistors, PMOS transistors, etc.) are included in the Figures. It is understood that, while certain transistors in different figures include like numbering, the similarly named transistors may be the same or different in example embodiments of the present invention.

Figure 4:
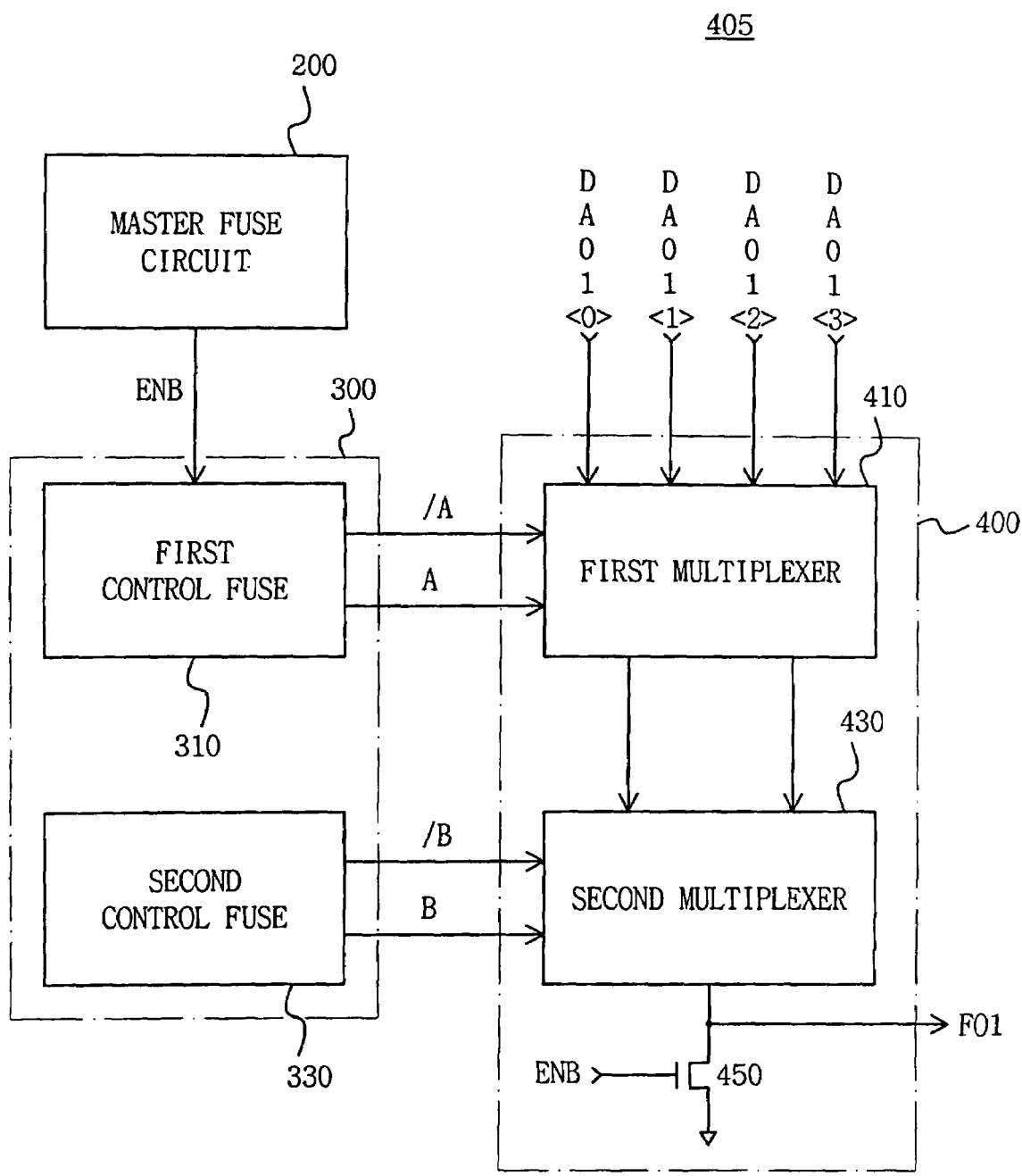
FIG. 4 is a block diagram illustrating a redundancy program circuit according to an example embodiment of the present invention.

FIG. 4 is a block diagram illustrating a redundancy program circuit 405 according to an example embodiment of the present invention.

In the example embodiment of FIG. 4, the redundancy program circuit 405 may include a master fuse circuit 200, a control fuse circuit 300, having a first control fuse 310 and a second control fuse 330, and a multiplexing circuit 400 having a first multiplexer 410 and a second multiplexer 430. The elements illustrated in FIG. 4 will be described in further detail below with reference to the example embodiments of FIG. 5 and FIG. 6.

Figure 5:
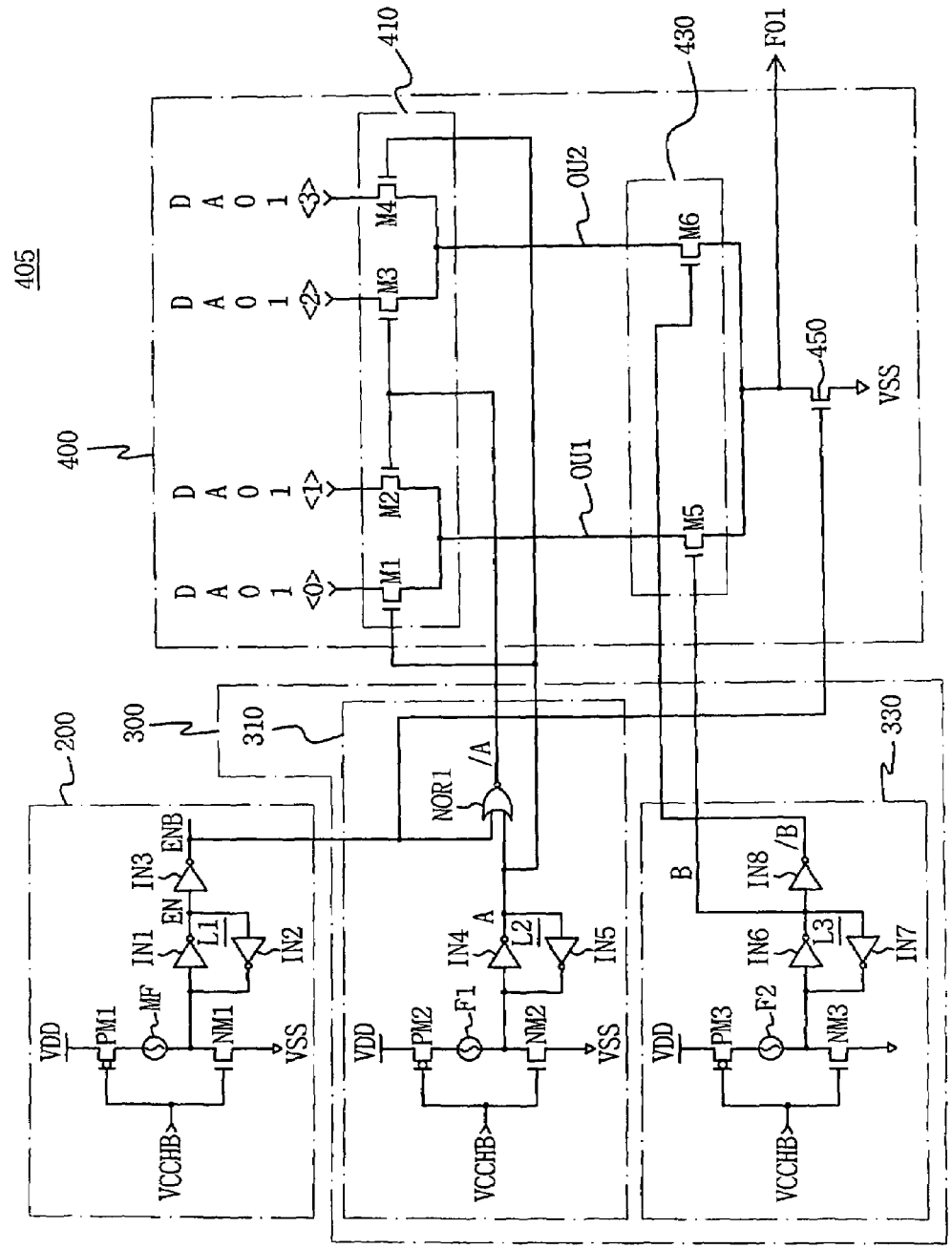
FIG. 5 is a circuit diagram illustrating the redundancy program circuit of FIG. 4 according to another example embodiment of the present invention.

FIG. 5 is a circuit diagram illustrating the redundancy program circuit 405 of FIG. 4 according to another example embodiment of the present invention.

In the example embodiment of FIG. 5, the master fuse circuit 200 may include a master fuse MF and may generate an operation enable signal ENB as a status signal that may indicate an operating status of the master fuse MF. In an example, the operating status may be whether the master fuse MF is cut or non-cut, where a cut status may indicate that current may not flow through the master fuse MF and a non-cut status may indicate that current may flow through the master fuse MF.

In the example embodiment of FIG. 5, the master fuse circuit 200 may include PMOS transistor PM1 and NMOS transistor NM1. Transistors PM1/NM1 may be connected to the master fuse MF and may receive a power-up bar signal VCCHB. The master fuse circuit 200 may further include an inverter latch L1 having an input terminal connected to an output terminal of the master fuse MF. The inverter latch L1 may include inverters IN1, IN2 and may be connected to an output inverter IN3. The power-up bar signal VCCHB may be an inverted version of a power-up signal VCCH. The power-up bar signal VCCHB may be maintained at a first logic level (e.g., a higher level) at an initiation of a power-up operation. The power-up bar signal VCCHB may transition to a second logic level (e.g., a lower logic level) after the power-up operation. The output of the output inverter IN3 may be the operation enable signal ENB.

In the example embodiment of FIG. 5, the control fuse circuit 300 may include at least two control fuses F1 and F2 and may generate first to Mth control signal pairs (e.g., where the Mth control pair corresponds to the Mth control fuse F1, F2, etc.) (A,/A), (B,/B), etc. as a status signal indicating an operating status of each corresponding control fuse F1, F2 (e.g., where the operating status is whether the fuse F1 and/or F2 may be cut or non-cut), where M is a natural number greater than or equal to 2.

In the example embodiment of FIG. 5, the first control fuse 310 may include PMOS transistor PM2 and NMOS transistor NM2. Transistors PM2/NM2 may be connected to the control fuse F1 and may receive the power-up bar signal VCCHB. The first control fuse 310 may further include an inverter latch L2 having an input terminal connected to an output terminal of the control fuse F1. The inverter latch L2 may include inverters IN4 and IN5 and may be connected to an output NOR gate NOR1.

In the example embodiment of FIG. 5, the second control fuse 330 may include PMOS transistor PM3 and NMOS transistor NM3. Transistors PM3/NM3 may be connected to the control fuse F2 and may receive the power-up bar signal VCCHB. The second control fuse 330 may further include an inverter latch L3 having an input terminal connected to an output terminal of the control fuse F2. The inverter latch L3 may include inverters IN6 and IN7 and may be connected to an output inverter IN8.

In the example embodiment of FIG. 5, the first, multiplexer 410 may include NMOS transistors M1-M4. The first multiplexer 410 may output given logic levels (e.g., the first logic level, the second logic level, etc.) of signal bit portions (e.g., DA01<0>, DA01<3>) among signal bits (e.g., DA01<0>, DA01<1>, DA01<2>, DA01<3>) of a decoding address applied in units of 2n bits, where n is a natural number greater than or equal to 2, to output terminals OU1 and OU2 provided by the number corresponding to the signal bit portions, in response to a corresponding control signal pair (e.g., control signal pair A,/A) from among the first to Mth control signal pairs.

In the example embodiment of FIG. 5, the second multiplexer 430 may include NMOS transistors M5 and M6. The second multiplexer 430 may operate (e.g., become enabled) when an operation enable transistor 450 is turned off. When the operation enable signal ENB is activated (e.g., set to the second logic level), the second multiplexer 430 may perform a subordinate half-reduction for the signal bit portion, received from output terminals of the first multiplexer 410, in response to control signal pairs (e.g., control signal pair B/B) that may not be applied to the first multiplexer 410 when the operation enable signal ENB is activated (e.g., set to the second logic level). The second multiplexer 430 may thereby transfer a given logic level (e.g., one of the first and second logic levels, which may correspond to a single bit) to a program output terminal FO1.

Hereafter, for purposes of explanation, a given terminal receiving a signal bit (e.g., DA01<0>) of a decoding address to perform a redundancy operation, may be referred to as a first output terminal. In an example, the first output terminal may correspond to the output terminal OU1 and other output terminals may be separated from the program output terminal FO1.

In another example embodiment of the present invention, during a redundancy operation, referring to the second multiplexer 430, only a given logic level of the first output terminal (e.g., output terminal OU1) may be transferred to the program output terminal FO1. Other output terminals (e.g., output terminal OU2) may be separated from the program output terminal FO1.

In another example embodiment of the present invention, referring to FIG. 5, if signal bits (DA01<0>, DA01<1>, DA01<2>, DA01<3>) of the decoding address include 4 bits (e.g., as shown in FIG. 5), an output of the multiplexing circuit 400, set to the first logic level, may be supplied to the program output terminal FO1. For example, if an address of a defective memory cell among normal memory cells is (00), the master fuse MF and the control fuses F1 and F2 may be cut (e.g., by a laser beam). The redundancy program may thereby be executed by a cutting operation.

In another example, referring to FIG. 5, after receiving a shipment of repaired semiconductor memory devices (e.g., repaired through a redundancy operation), an address (e.g., address (00)) indicating an address of defective memory cell may be applied in a normal operation state such that signal bits (DA01<0>, DA01<1>, DA01<2>, DA01<3>) of a decoding address may correspond to (00, 01, 10, 11), respectively, the operation enable signal ENB may be generated at the second logic level, the control signal pair A,/A may be generated at the first logic level and the second logic level, respectively, the control signal pair B,/B may be generated at the first logic level and the second logic level, respectively. The operation enable signal ENB may be set to the second logic level because NMOS transistor NM1 may be turned on when the power-up bar signal VCCHB is applied at the first logic level such that the master fuse MF may be cut.

An output EN of the inverter latch L1 may transition to the first logic level and the operation enable signal ENB (e.g., the output of the output inverter IN3) may transition to the second logic level. When the power-up bar signal VCCHB transitions to the second logic level, the NMOS transistor NM1 may be turned off and the output EN of the inverter latch L1 may be maintained at the first logic level. The power-up bar signal VCCHB and the operation enable signal ENB may be maintained at the second logic level for a given period of time.

In another example, if the outputs control signal A and /A of the control signal pair AJA are set to the first logic level and the second logic level, respectively, the NMOS transistor NM1 may be turned on when the power-up bar signal VCCHB is applied at the first logic level such that the control fuse F1 may be cut. The control signal A (e.g., of the control signal pair AJA) of the inverter latch L2 may transition to the first logic level, and the control signal /A of NOR gate NOR1 (e.g., for NOR-gating the operation enable signal ENB and the control signal A) may transition to the second logic level. When the power-up bar signal VCCHB transitions to the second logic level, the NMOS transistor NM1 may be turned off and the control signal A of the inverter latch L2 may be maintained at the first logic level. Thus, the power-up bar signal VCCHB and the control signals A and /A of the control signal pair AJA may be maintained at their respective logic levels for a given period of time.

Further, in another example, if the control signals B and /B of the control signal pair B,/B are generated at the first logic level and the second logic level, respectively, the operation of the second control fuse 330 may be similar as the above-described example with respect to first control fuse 310 where the control signals A and /A of the control signal pair A,/A are set to the first and second logic levels, respectively.

In another example, if the operation enable signal ENB is activated, the control signal pair A,/A and the control signal pair B,/B may transition to the second logic level, the first logic level, the second logic level, the first logic level and the second logic level, respectively, the operation enable transistor 450 may be turned off, transistors M1 and M4 of the first multiplexer 410 may be turned on, and a transistor M5 of second multiplexer 430 may be turned on. The redundancy enable signal RENi may transition to the first logic level and may be outputted to the program output terminal FO1. The redundancy enable signal RENi may correspond to the signal bit DA01<0> of the decoding address, for example, the address (00). A redundancy operation may be performed for the address (00) by cutting the master fuse MF and the control fuses F1 and F2, (e.g., when the redundancy enable signal RENi may be activated when an address of (00) may be applied in a normal operation of a semiconductor device (e.g., a semiconductor memory device)) thereby debugging or correcting operation for a semiconductor device including the redundancy program circuit 405.

Alternatively, in another example, if a redundancy operation is performed for address (01), a signal bit DA01<1> of the decoding address may correspond to address (01) and the master fuse MF and the control fuse F2 may be cut. In another alternative example, if a redundancy operation is performed for address (10), a signal bit DA01<1> of the decoding address may correspond to address (10) and the master fuse MF may be cut. In another alternative example, if a redundancy operation is performed for address (11), a signal bit DA01<1> of the decoding address may correspond to address (11) and the master fuse MF and the control fuse F1 may be cut.

In another example embodiment of the present invention, referring to FIG. 5, a redundancy operation may be performed with multiplexers which may control a plurality of fuses numbering less than a number of address bits (e.g., of a decoding address).

Figure 6:
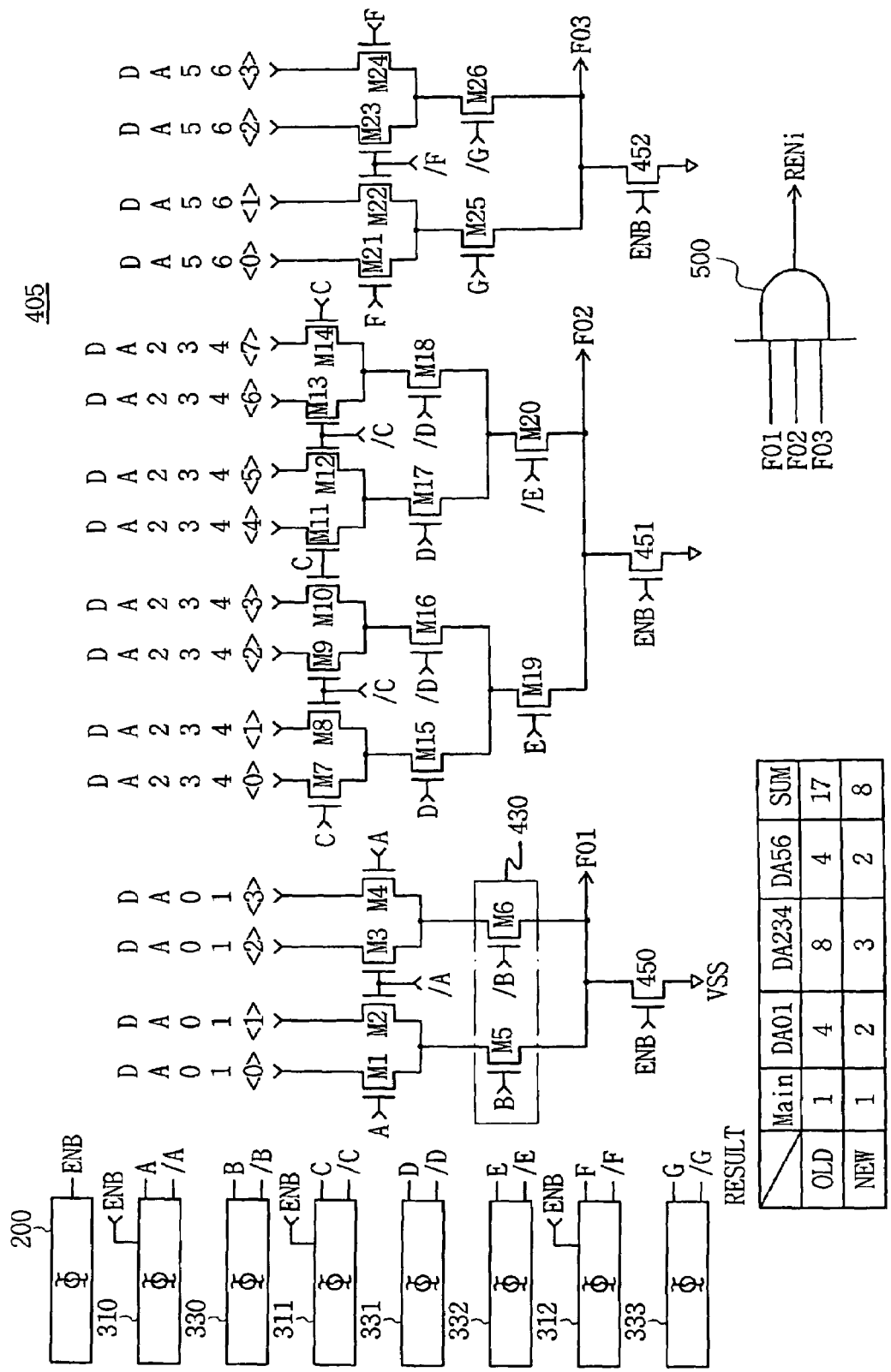
FIG. 6 is another circuit diagram illustrating the redundancy program circuit of FIG. 4 according to another example embodiment of the present invention.

FIG. 6 is a circuit diagram illustrating the redundancy program circuit 405 of FIG. 4 according to another example embodiment of the present invention.

In an example, in contrast to FIG. 5 where first and second control fuses 310/330 may be included based on the decoding address having 4 bits, FIG. 6 illustrates seven control fuses (e.g., 310, 330, 311, 331, 332, 312, 333, etc.) based on the decoding address having 16 bits.

In an alternative example embodiment of the present invention, if signal bits of a decoding address are increased to 16 bits, a redundancy control circuit (e.g., redundancy program circuit 405) may include a higher number of control fuses (e.g., seven) and a number of multiplexers.

In the example embodiment of FIG. 6, the second multiplexer 430 of FIG. 5 may be one of a plurality of multiplexers corresponding to program output terminals FO1, FO2 and FO3, respectively, the outputs of which may be received by an AND gate 500. The output of the AND gate 500 may be the redundancy enable signal RENi.

In the example embodiment of FIG. 6, the redundancy program circuit 405 may include a total of eight fuses (e.g., including one master fuse MF and seven control fuses 310/311/312/330/331/332/333). Thus, fewer control fuses than decoding address bits may be used for a redundancy operation.

In another example embodiment of the present invention, control fuses may be installed within control fuse circuit 300 and the redundancy enable signal RENi may be generated with a multiplexing operation. The above-described example embodiment may allow a reduction (e.g., a half-reduction) for signal bits of the decoding address and the number of fuses used for a redundancy program may thereby be reduced. The reduced number of fuses may reduce a chip size. Further, a number of cutting operations may be reduced by the reduction of the number of fuses, thereby increasing an efficiency and speed of a redundancy operation (e.g., a repair or debugging time for semiconductor devices including the redundancy program circuit 405).

Figure 7:
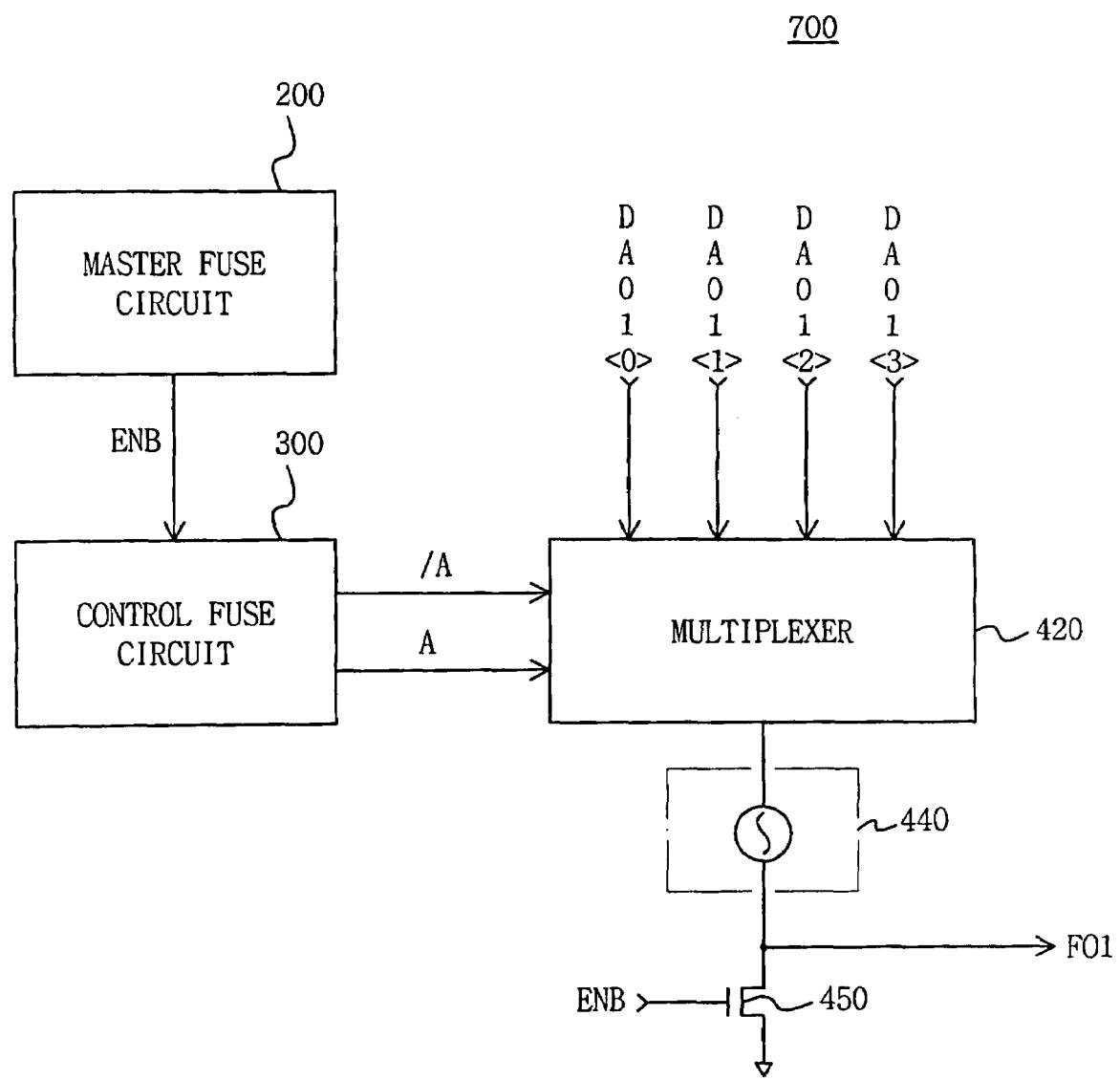
FIG. 7 is a block diagram illustrating a redundancy program circuit according to another example embodiment of the present invention.

FIG. 7 is a block diagram illustrating a redundancy program circuit 700 according to another example embodiment of the present invention.

In the example embodiment of FIG. 7, the redundancy program circuit may include the master fuse circuit 200 (e.g., as above-described with respect to FIGS. 4-6), the control fuse circuit 300 (e.g., as above-described with respect to FIGS. 4-6), a multiplexer 420 and a program fuse circuit 440. The elements illustrated in FIG. 7 will be described in further detail below with reference to the example embodiments of FIG. 8 and FIG. 9.

Figure 8:
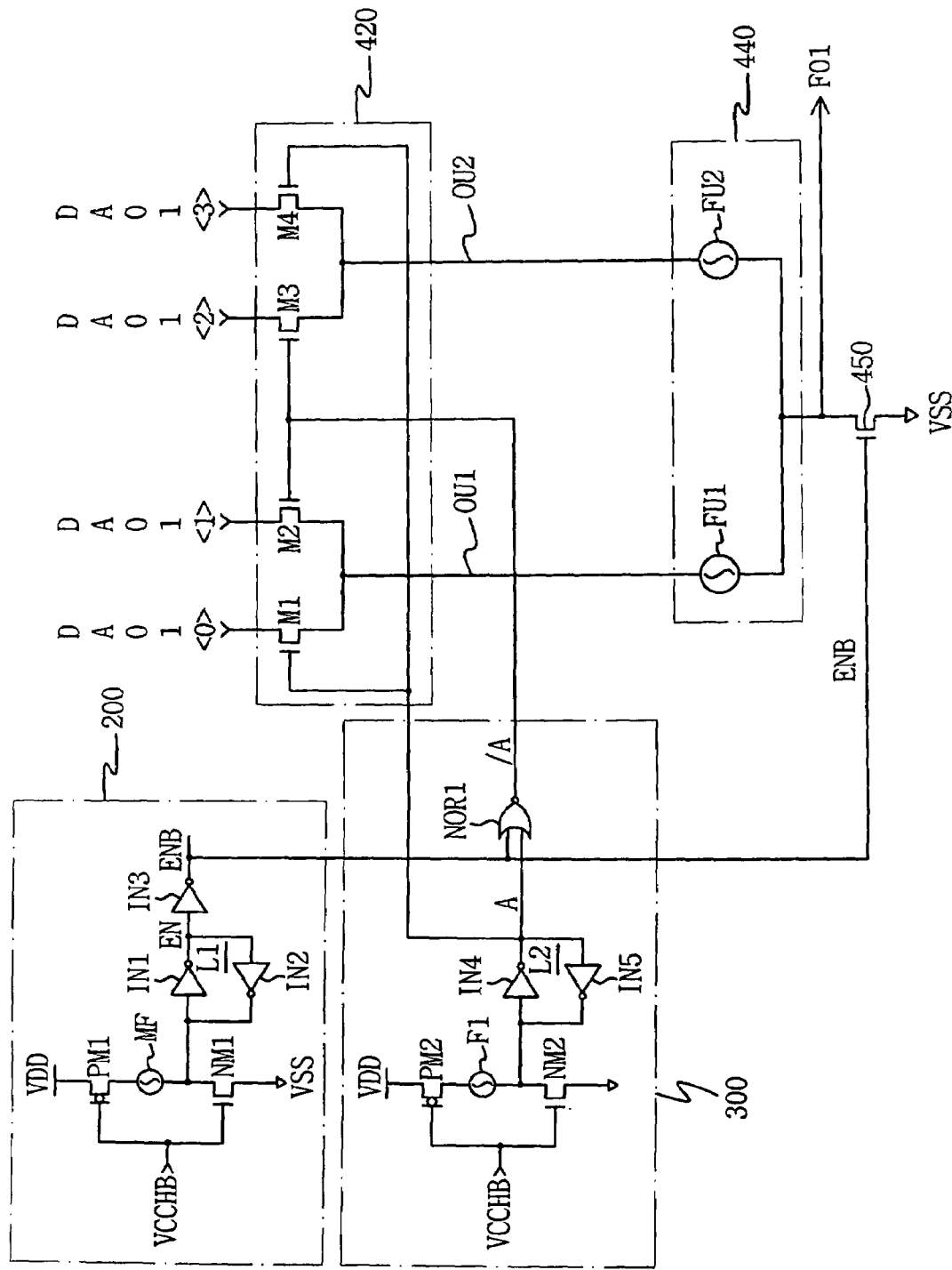
FIG. 8 is a circuit diagram illustrating the redundancy program circuit of FIG. 7 according to another example embodiment of the present invention.

FIG. 8 is a circuit diagram illustrating the redundancy program circuit 700 of FIG. 7 according to another example embodiment of the present invention.

In the example embodiment of FIG. 8, the master fuse circuit 200 may function as the master fuse circuit 200 as described above with respect to FIG. 5. The control fuse circuit 300 may function as the first control fuse 310 in the control fuse circuit 300 of FIG. 5. The multiplexer 420 may function as the first multiplexer 410 of FIG. 5. Thus, the descriptions of master fuse circuit 200, control fuse circuit 300 and multiplexer 420 are omitted in the description of the example embodiment of FIG. 8 for the sake of brevity.

In the example embodiment of FIG. 8, the program fuse circuit 440 may include program fuses FU1 and FU2. The program fuse circuit 440 may operate (e.g., become enabled) when an operation enable transistor 450 is turned off. When the operation enable signal ENB is activated (e.g., transitions to the second logic level) the program fuse circuit 440 may transition to the logic level associated with a given bit (e.g., DA01<0>) based on at least one programmed fuse (e.g., a non-cutting of FU1 and a cutting of FU2) among fuses FU1 and FU2 connected to corresponding to output terminals OU1 and OU2, respectively, of the multiplexer 420. The output of the program fuse circuit 440 may be received by the program output terminal FO1.

In another example embodiment of the present invention, the program fuse circuit 440 may transfer a logic level received from the first output terminal OU1 to the program output terminal FO1 through fuse FU1 connected to the first output terminal OU1. The output terminal OU2 may not operatively connected to the program output terminal FO1 because of a cutting of fuse FU2 which may be connected to at least one output terminal OU2 that may be independent or separate from the first output terminal OU1. In an alternative example, the fuse FU2 may be non-cut and the fuse FU1 may be cut (e.g., based on another received signal bit for the redundancy operation).

In the example embodiment of FIG. 8, when signal bits (DA01<0>, DA01<1>, DA01<2>, DA01<3>) of the decoding address include 4 bits, the redundancy enable signal RENi may be set to the first logic level and may be outputted to the program output terminal FO1. For example, if an address of a defective memory cell is address (00), the master fuse MF, the control fuse F1 and the program fuse FU2 may be cut (e.g., by a laser beam) to perform a redundancy operation.

In another example, signal bits (DA01<0>, DA00<1>, DA01<2>, DA01<3>) may correspond to (00, 01, 10, 11), respectively. In a further example, the redundancy enable signal RENi may correspond to the signal bit DA01<0> of the decoding address, for example, the address (00). A redundancy operation may be performed at address (00) by cutting the master fuse MF, the control fuse F1, and the program fuse FU2 when the redundancy enable signal RENi is activated for the address (00) (e.g., when the address (00) may be applied in a normal operation of a semiconductor device (e.g., a semiconductor memory device)), thereby debugging or correcting operation for the semiconductor device.

Alternatively, in another example, the redundancy enable signal RENi may correspond to the signal bit DA01<1> of the decoding address, for example, the address (01). A signal bit DA01<1> of the decoding address may correspond to address (01) and the master fuse MF and the program fuse FU2 may be cut. In another alternative example, the redundancy enable signal RENi may correspond to the signal bit DA01<2> of the decoding address, for example, the address (10). A signal bit DA01<2> of the decoding address may correspond to address (10) and the master fuse MF and the program fuse FU1 may be cut. In another alternative example, the redundancy enable signal RENi may correspond to the signal bit DA01<3> of the decoding address, for example, the address (11). A signal bit DA01<3> of the decoding address may correspond to address (11) and the master fuse MF, the control fuse F1, and the program fuse FU1 may be cut.

In another example embodiment of FIG. 8, an address (00) may indicate an address of a defective memory cell and may be applied during normal operation of a semiconductor device. Signal bits (DA01<0>, DA01<1>, DA01<2>, DA01<3>) of a decoding address may correspond to (00, 01, 10 and 11), respectively. The operation enable signal ENB may be generated at the second logic level, and a control signal pair A,/A may be generated such that control signal A may be at the first logic level and control signal /A may be at the second logic level.

The operation enable transistor 450 may be turned off, transistors M1 and M4 of multiplexer 420 may be turned on, and the program fuse FU1 may not be cut. Thus, the redundancy enable signal RENi may be output at the first logic level to the program output terminal FO1. The received redundancy enable signal RENi may correspond to a signal bit DA01<0> of the decoding address, which may the address (00). A redundancy operation may be required to debug a semiconductor device by cutting the master fuse MF, the control fuses F1 and the program fuse FU1 (e.g., when an address (00) of a defective memory cell may be applied during operation of a semiconductor device).

In another example embodiment of FIG. 8, an address of a defective memory cell may be the address (01). In this example, a redundancy operation may cut the master fuse MF and the program fuse FU2 to debug the semiconductor device.

In another example embodiment of FIG. 8, an address of a defective memory cell may be the address (10). In this example, a redundancy operation may cut the master fuse MF and the program fuse FU1 to debug the semiconductor device.

In another example embodiment of FIG. 8, an address of a defective memory cell may be the address (11). In this example, a redundancy operation may cut the master fuse MF, the fuse F1 and the program fuse FU1 to debug the semiconductor device.

In another example embodiment of FIG. 8, a redundancy program may be performed such that a multiplexing operation may be executed which may thereby control signal bits of a decoding row address and/or decoding column address, thereby reducing a number of use fuses and shortening a duration of a redundancy operation (e.g., as compared to a conventional redundancy operation).

Figure 9:
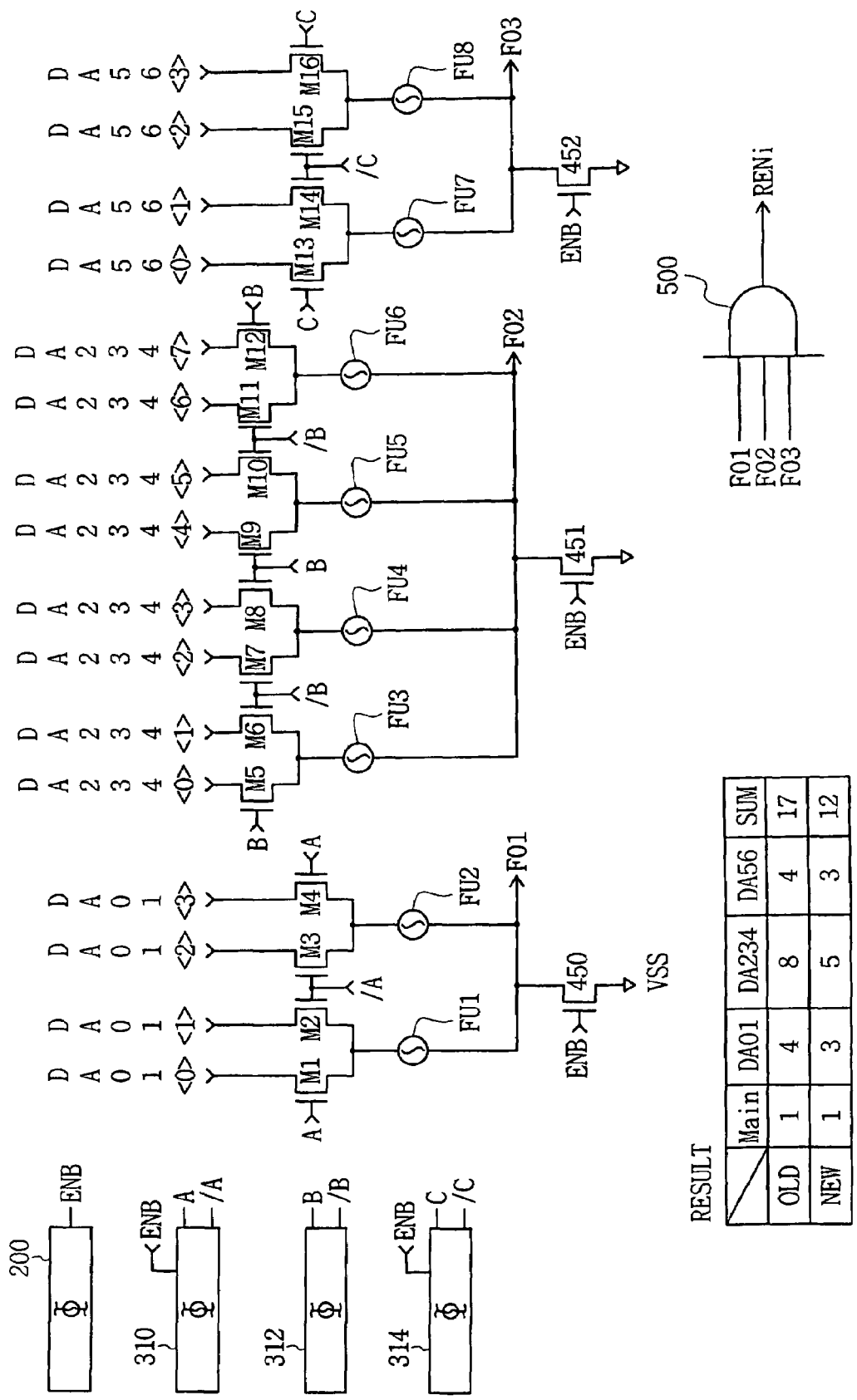
FIG. 9 is a circuit diagram illustrating the redundancy program circuit of FIG. 7 according to another example embodiment of the present invention.

FIG. 9 is a circuit diagram illustrating the redundancy program circuit 700 of FIG. 7 according to another example embodiment of the present invention.

In contrast to the example embodiment of FIG. 8 where the number of fuses may be four (one master fuse MF, one control fuse F1, and two program fuses FU1, FU2) if signal bits of the decoding address may include 4 bits, FIG. 9 illustrates another example embodiment of the present invention where the number of fuses may be reduced when signal bits of the decoding address are increased.

In the example embodiment of FIG. 9, if signal bits of a decoding address increase to 16 bits, the redundancy program circuit 900 may include twelve fuses, with one master fuse MF, three control fuses, and eight program fuses (e.g., FU1-FU8).

Figure 10:
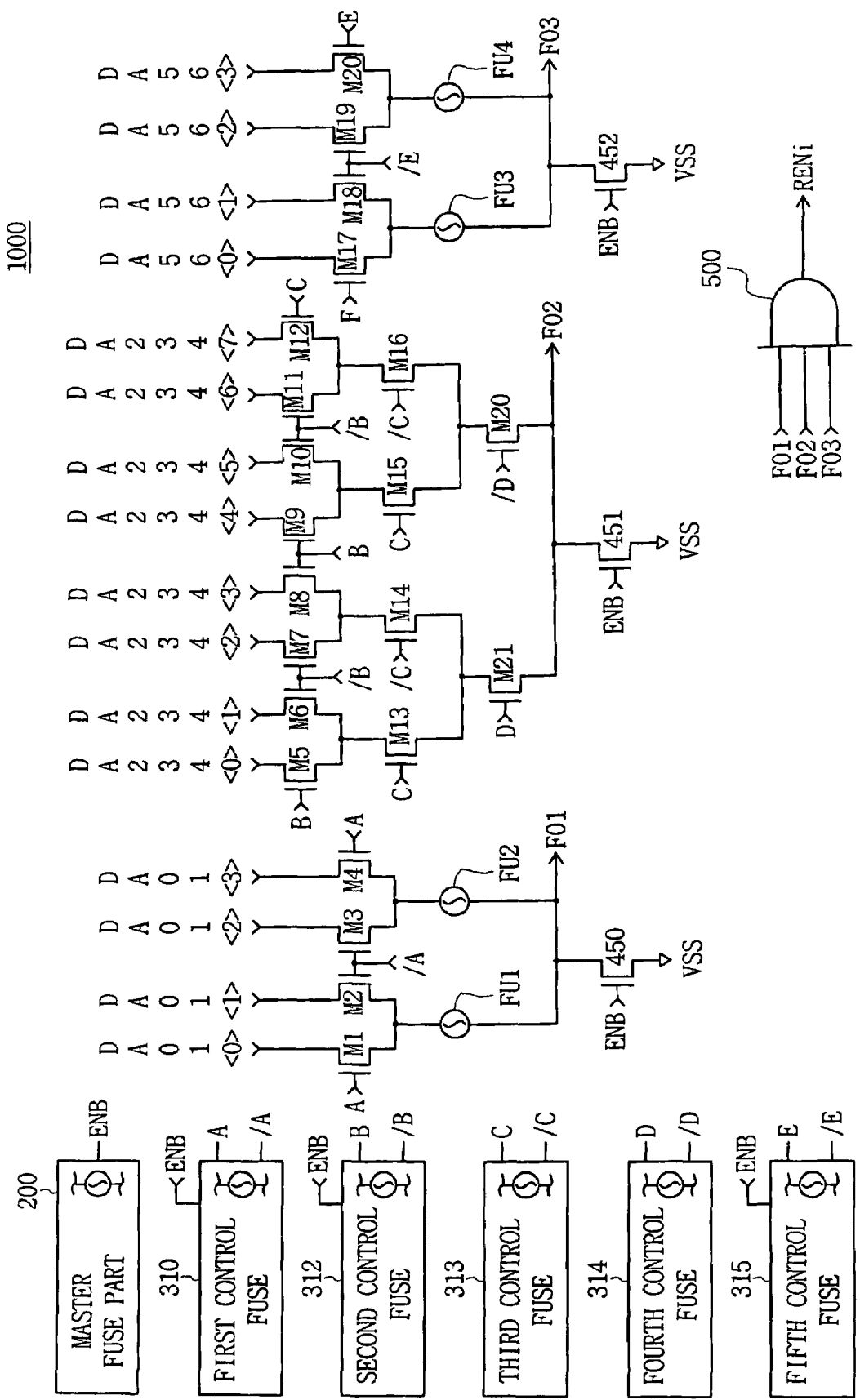
FIG. 10 is a circuit diagram illustrating a redundancy program circuit according to another example embodiment of the present invention.

FIG. 10 is a circuit diagram illustrating a redundancy program circuit 1000 according to another example embodiment of the present invention.

In the example embodiment of FIG. 10, the redundancy program circuit 1000 may include the master fuse circuit 200 and control fuses 310, 312, 313, 314 and 315, through which signal bits (DA01<0>, DA01<1>, DA01<2>, DA01<3>) of the decoding address and signal bits (DA56<0>, DA56<1>, DA56<2>, DA56<3>) of the decoding address may be multiplexed and outputted through the program output terminals FO1 and FO3. Signal bits (DA234<0>-DA234<7>) of the decoding address may be multiplexed and outputted through the program output terminal FO2, and control signal pairs B,/B, C,/C and D,/D may be applied to multiplexers. Logic levels (e.g., the first logic level, the second logic level, etc.) at the terminals FO1, FO2 and FO3 may be gated by the AND gate 500. The AND gate 500 may output the redundancy enable signal RENi.

In the example embodiment of FIG. 10, the redundancy program circuit 1000 may include a total of ten fuses (e.g., a master fuse and nine fuses).

Figure 11:
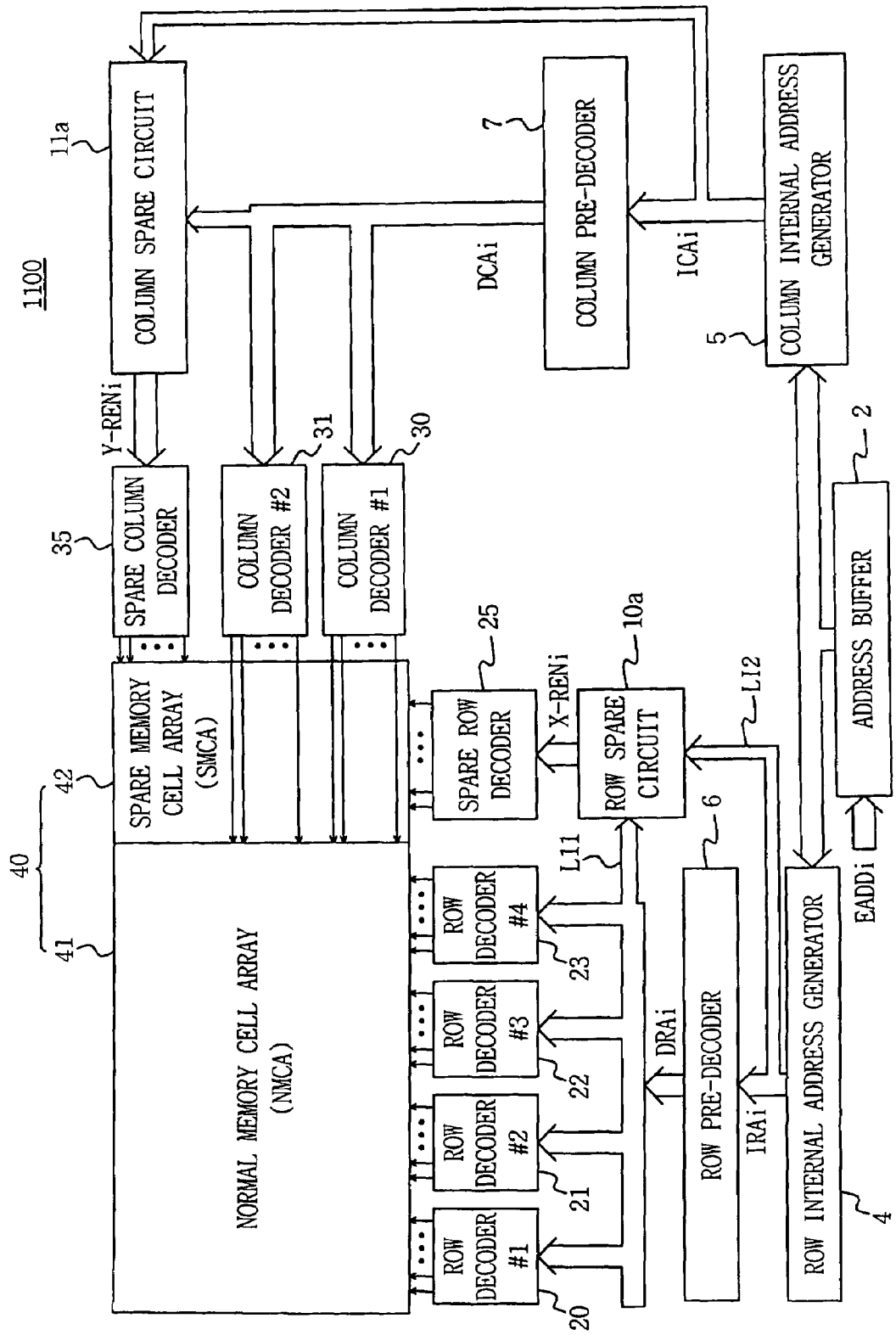
FIG. 11 is a block diagram illustrating a semiconductor memory device according to another example embodiment of the present invention.

FIG. 11 is a block diagram illustrating a semiconductor memory device 1100 according to another example embodiment of the present invention.

In the example embodiment of FIG. 11, the semiconductor device 1100 may generally function similar to the conventional semiconductor device 107 of FIG. 1. However, the semiconductor device 1100 of FIG. 11 may include a row spare circuit 10a and a column spare circuit 11a, which may differ in function as compared to the row spare circuit 10 and the column spare circuit 11 of FIG. 1.

In the example embodiment of FIG. 11, a portion of signal bits of a decoded address of the row predecoder 6 (e.g., the output of row predecoder 6) may be transferred to an input line L11 and thereby to the row spare circuit 10a. A portion of signal bits of an internal address outputted from the row internal address generator 4 (e.g., the input of row predecoder 6) may be transferred to an input line LI2 and thereby to the row spare circuit 10a.

In the example embodiment of FIG. 11, a portion of signal bits of a decoded address of the column predecoder 7 (e.g., the output of column predecoder 7) may be transferred to the column spare circuit 11a A portion of signal bits of an internal address outputted from the column internal address generator 5 (e.g., the input of column predecoder 7) may be received by the column spare circuit 11a.

In the example embodiment of FIG. 11, fuses may be disposed in a one-to-one ratio with respect to the decoded address bits. Fuses may also be disposed corresponding to the portion of address bits before decoding.

Figure 12:
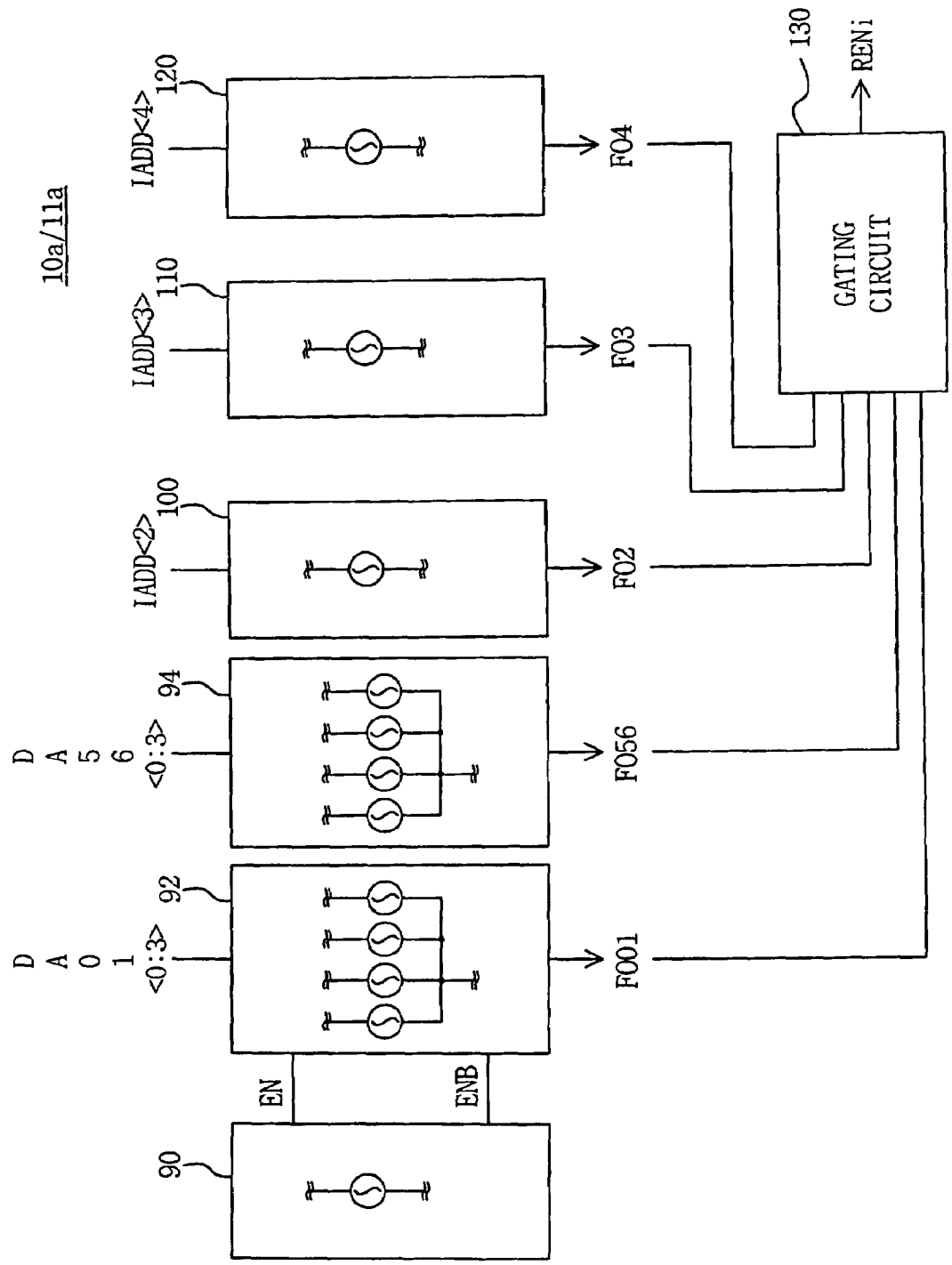
FIG. 12 is a block diagram illustrating an example of a row/column spare circuit according to another example embodiment of the present invention.

FIG. 12 is a block diagram illustrating an example of the row/column spare circuit 10a/11a of FIG. 11 according to another example embodiment of the present invention.

Figure 13:
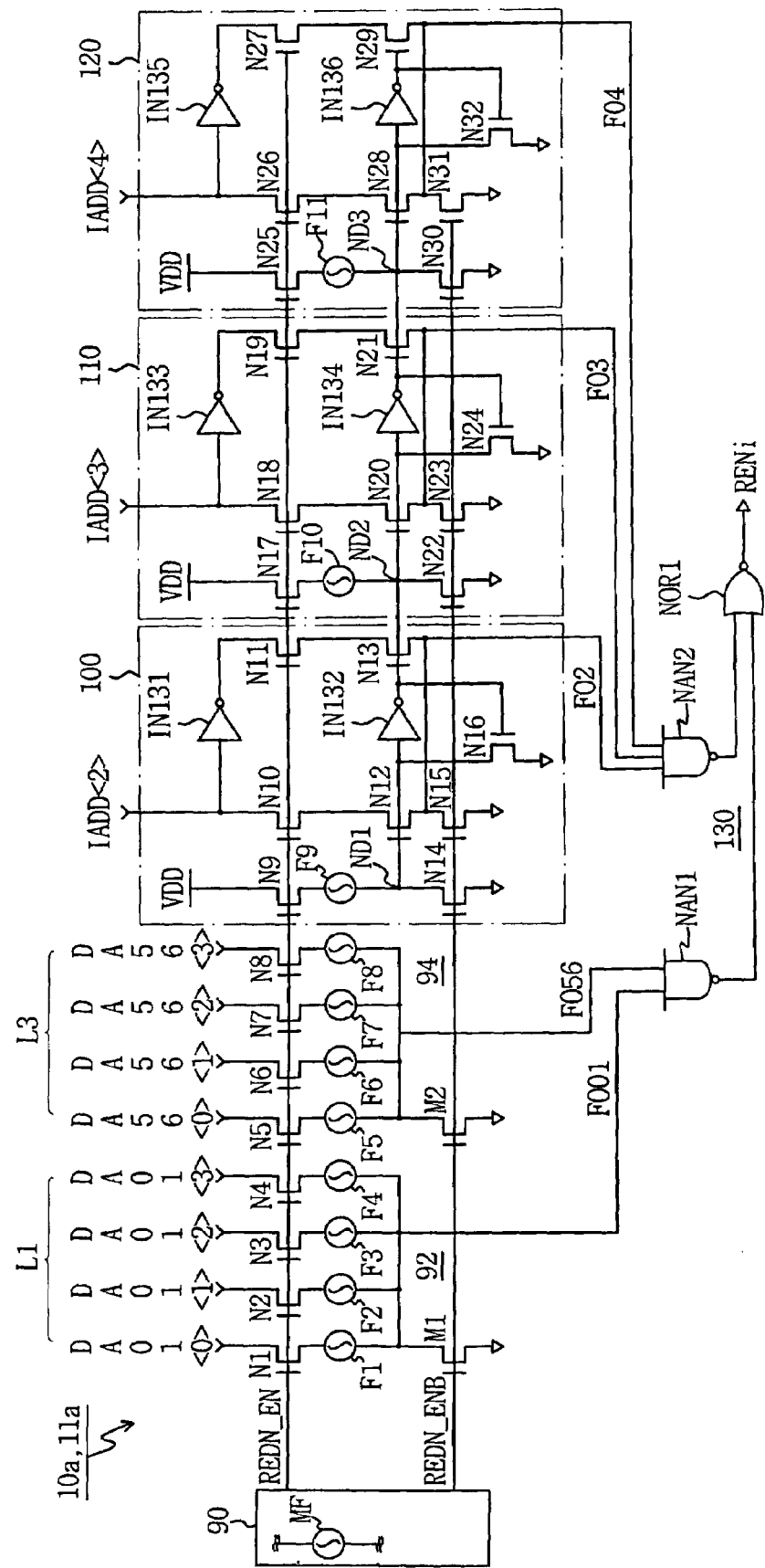
FIG. 13 is a circuit diagram illustrating the row/column spare circuit of FIG. 12 according to another example embodiment of the present invention.

FIG. 13 is a circuit diagram illustrating the row/column spare circuit 10a/11a of FIG. 12 according to another example embodiment of the present invention.

In the example embodiment of FIGS. 12 and 13, the row/column spare circuit 10a/11a may include a master fuse circuit 90 for generating operation enable signals EN and ENB. The row/column spare circuit 10a/11a will be described in greater detail later with respect to FIG. 14. The row/column spare circuit 10a/11a may further include first fuse box circuits 92/94, second fuse box circuits 100/110/120 and a gating circuit 130.

Figure 14:
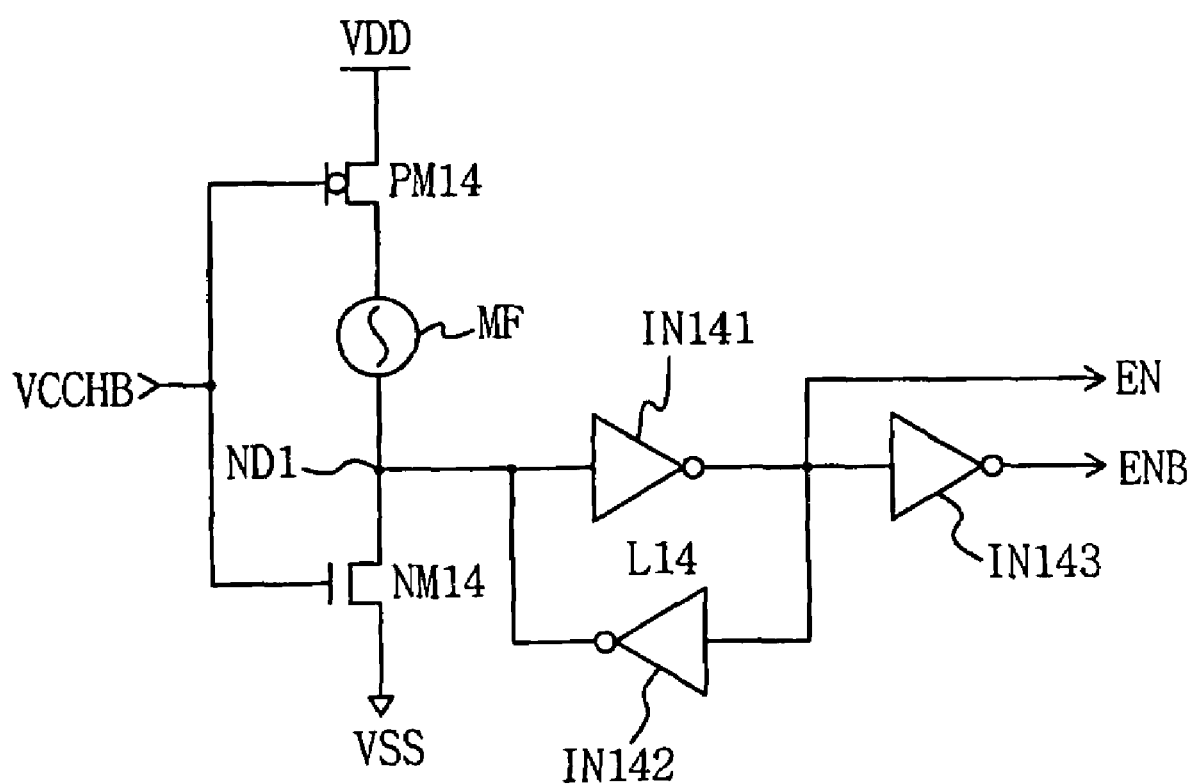
FIG. 14 is a circuit diagram illustrating a master fuse circuit according to another example embodiment of the present invention.

FIG. 14 is a circuit diagram illustrating the master fuse circuit 90 of FIG. 12 according to another example embodiment of the present invention. Master fuse circuit 90 may include PMOS transistor PM14 and NMOS transistor NM14 which may each be connected to the master fuse MF. The transistors PM14 and NM14 may receive the power-up bar signal VCCHB. Master fuse circuit 90 may further include an inverter latch L14 which may include inverters IN141 and IN142. The mater fuse circuit 90 may further include an output inverter IN143.

In the example embodiment of FIGS. 12 and 13, the first fuse box circuits 92 and 94 may include program fuses disposed corresponding to respective decoding signal bits DA01<0:3> and DA56<0:3>. First fuse box circuits 92 and 94 may generate first fuse box output signals FO01 and FO56, respectively, in response to the operation enable signals EN/ENB.

In the example embodiment of FIGS. 12 and 13, the second fuse box circuits 100, 110 and 120 may include program fuses disposed corresponding to signal bits of an internal address IADD<2>, IADD<3> and IADD<4> which may be generated before an applied external address may be decoded. Second fuse box circuits 100/110/120 may generate a second fuse box output signal FO2, FO3 and FO4, respectively in response to the operation enable signals EN/ENB.

In the example embodiment of FIG. 12, the gating circuit 130 may gate (e.g., AND gate) the first and second fuse box output signals FO01, FO56, FO2, FO3 and FO4, and may generate the redundancy enable signal RENi.

In the example embodiment of FIG. 13, the first fuse box circuit 92 may include NMOS transistors N1-N4, program fuses F1-F4 connected to source terminals of the NMOS transistors N1-N4, and an operation enable NMOS transistor M1.

In the example embodiment of FIG. 13, the first fuse box circuit 94 may include NMOS transistors N5-N8, program fuses F5-F8 connected to source terminals of the NMOS transistors N5-N8 and an operation enable NMOS transistor M2.

In the example embodiment of FIG. 13, the second fuse box circuit 100 may include a program fuse F9, inverters IN131/IN132 and NMOS transistors N9-N16. The second fuse box circuit 120 may include a program fuse F11, inverters IN135/IN136 and NMOS transistors N25-N32.

In the example embodiment of FIG. 13, the gating circuit 130 may include NAND gates NAN1/NAN2 and a NOR gate NOR1.

An example of a redundancy program operation for the second fuse box circuit 100 of FIG. 13 will now be described.

In the example operation of FIG. 13, a node ND1 may be maintained as the second logic level at a power-up initial operation. If the program fuse F9 is not cut, a logic level of the node ND1 may transition to the first logic level (e.g., power source voltage VDD applied through the fuse F9, an external power source voltage, etc.). The NMOS transistors N10 and N12 may be turned on and the NMOS transistors N13 and N16 may be turned off. A source terminal of the NMOS transistor N12 may be connected to a program output terminal FO2. An input logic of signal bit IADD<2> of an internal address may pass through transistor N10, transistor N12 and program output terminal FO2, and may be applied as an input of the NAND gate NAN2.

Alternatively, if the fuse F9 is cut, the input logic of signal bit LADD<2> may be cut off (e.g., the logic level may be the second logic level irrespective of the logic level of the signal bit IADD<2>). A signal path through transistor N11, transistor N13 and program output terminal FO2 may be activated and the signal bit LADD<2> of an internal address inverted by inverter IN1 may be applied as an input of the NAND gate NAN2.

In the example embodiment of FIG. 13, the row/column spare circuit 10a/11a may include twelve fuses.

Figure 15:
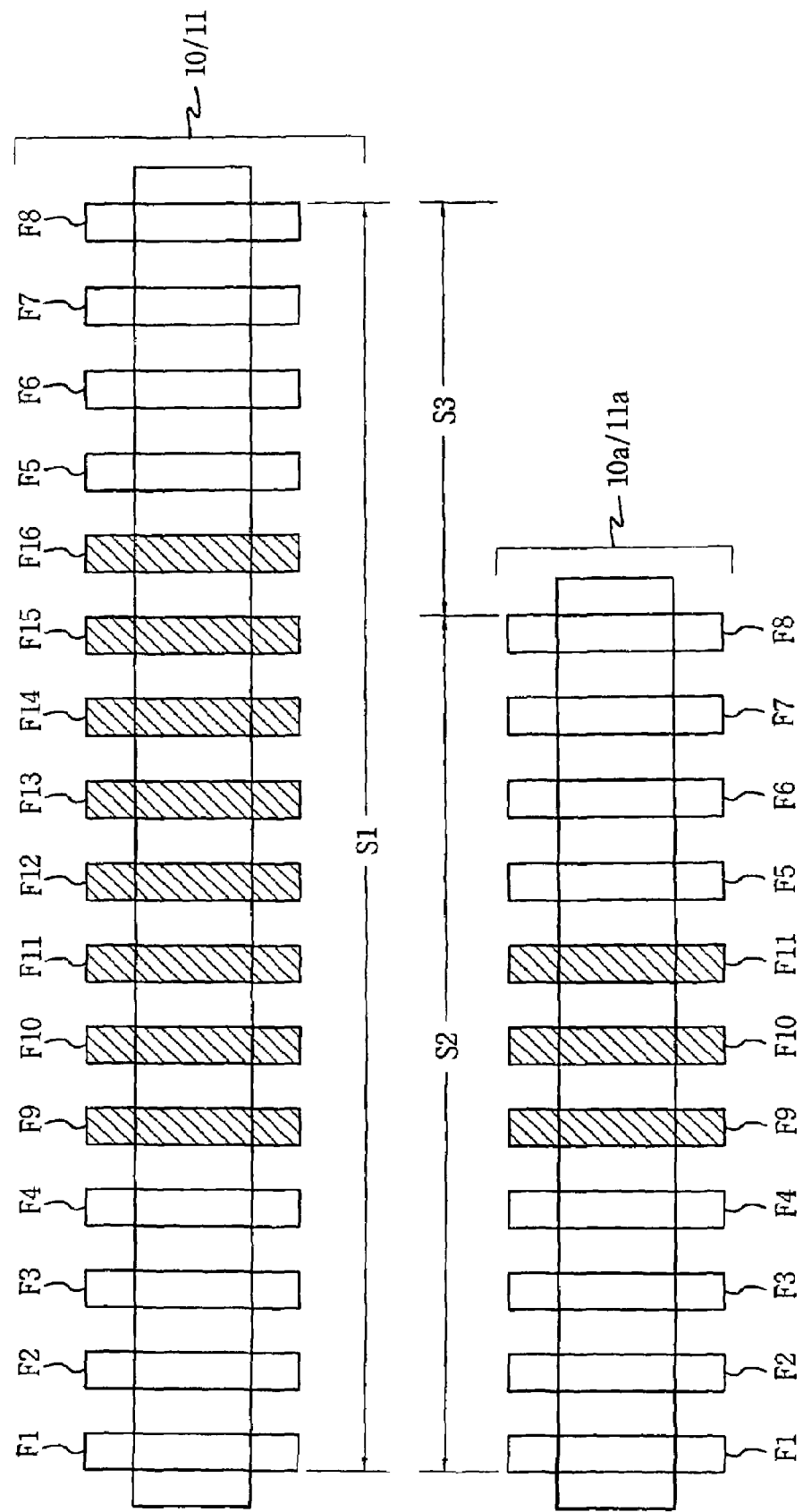
FIG. 15 illustrates a fuse reduction example according to the example embodiment of FIG. 13.

FIG. 15 illustrates a fuse reduction example according to the example embodiment of FIG. 13.

In the example embodiment of FIG. 15, eleven fuses (e.g., not counting the master fuse MF) may be included in the row/column spare circuit 10a/11a. As discussed in the background of the invention, the conventional row/column spare circuit 10/11 may include sixteen fuses.

In the example embodiment of FIG. 15, the convention row/column spare circuits 10/11 may each take up space S1 and the row/column spare circuits 10a/11a may each take up space S2 on a semiconductor chip. Extra space S3 may indicate a "saved" amount of space by employment of the row/column spare circuits 10a/11a in place of the conventional row/column spare circuits 10/11. The extra space S3 may be provided by removing fuses F12-F16 of the row/column spare circuit 10/11. The reduced chip size may reduce a layout size and/or a repair time of a semiconductor device (e.g., semiconductor device 1100).

Figure 16:
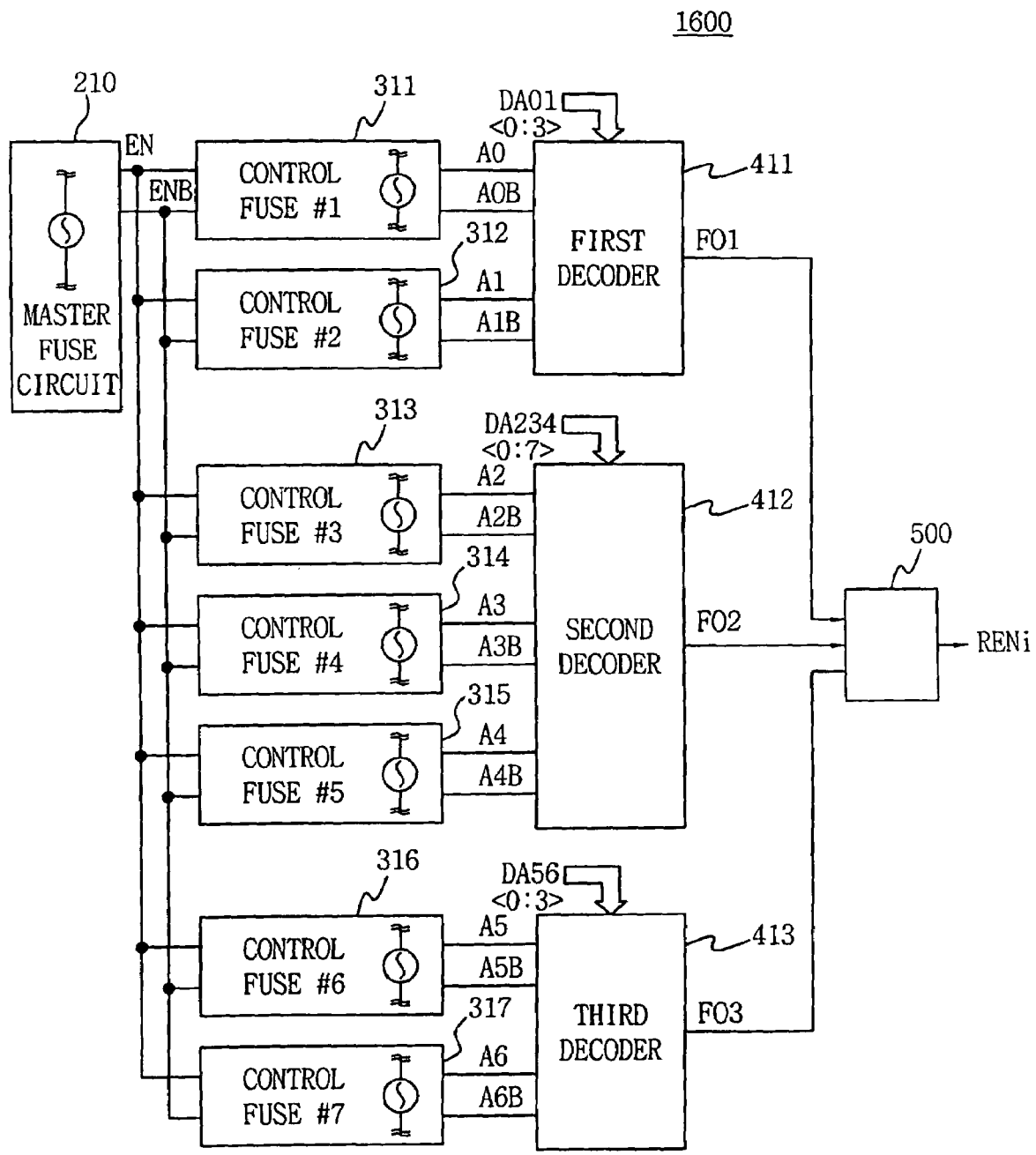
FIG. 16 is a block diagram of a redundancy program circuit according to another example embodiment of the present invention.

FIG. 16 is a block diagram of a redundancy program circuit 1600 according to another example embodiment of the present invention. The redundancy program circuit 1600 illustrates an example where the decoding address may include 16 bits.

In the example embodiment of FIG. 16, the redundancy program circuit 1600 may include a number of fuses corresponding to a number of bits in an external address or an internal address. In contrast, the conventional row/column spare circuit 10/11 of FIG. 1 may include a fuse for each signal bit of the decoding address. In an example, if an internal address includes 3 bits and a decoded or decoding address includes 8 bits, the conventional row/column spare circuit 10/11 may include 8 fuses. In contrast, in the above-example, the redundancy program circuit 1600 according to an example embodiment of the present invention may include 3 fuses.

In the example embodiment of FIG. 16, the redundancy program circuit 1600 may include a master fuse circuit 210, a plurality of control fuse circuits 311-317, a combination circuit 500, first decoder 411, a second decoder 412 and a third decoder 413.

In the example embodiment of FIG. 16, the master fuse circuit 210 may include a master fuse MF and may generate operation enable signals EN/ENB to indicate an operating status (e.g., whether the master fuse MF is cut or non-cut) of the master fuse MF.

Figure 17:
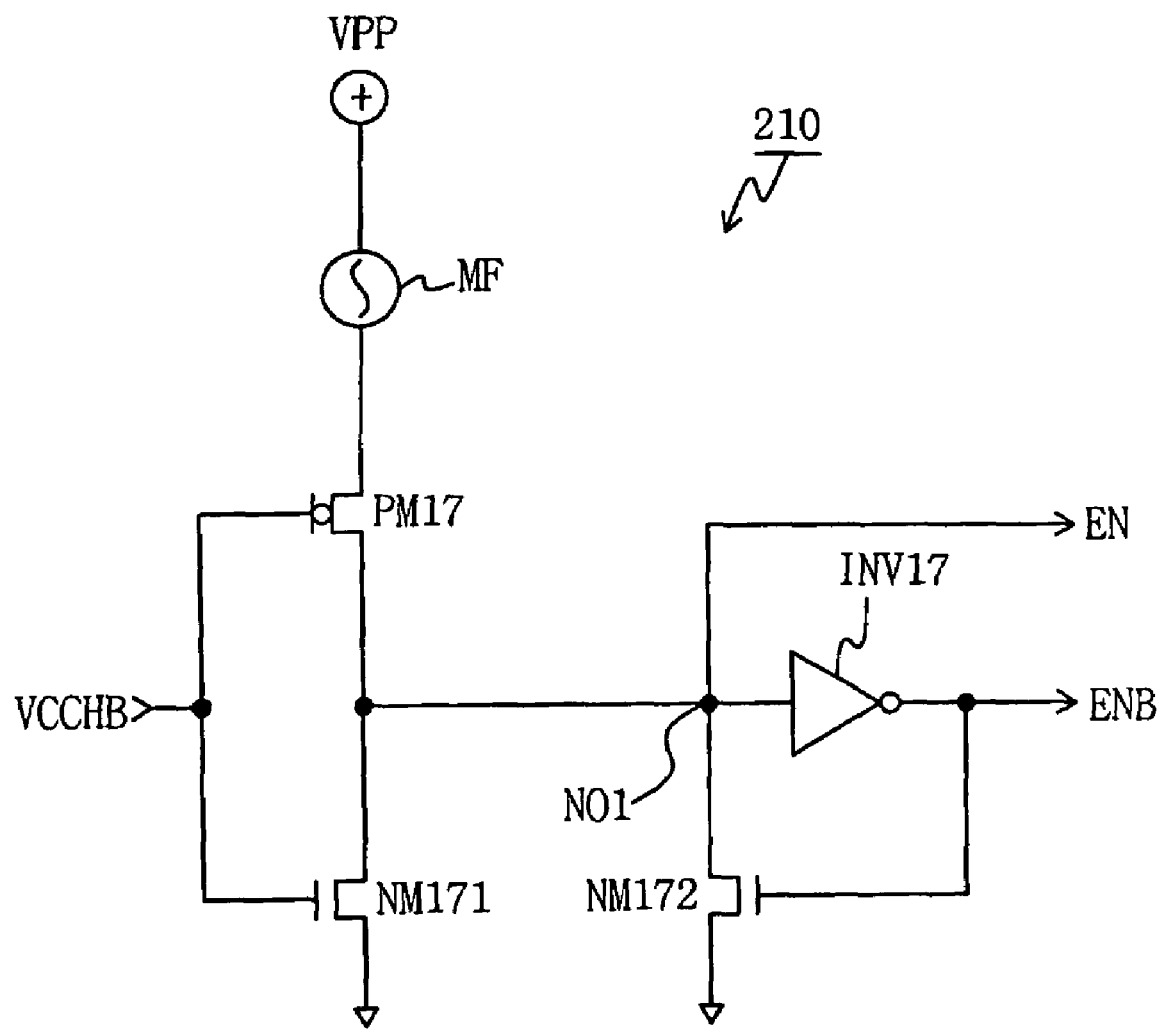
FIG. 17 is a circuit diagram illustrating a master fuse circuit according to another example embodiment of the present invention.

FIG. 17 is a circuit diagram illustrating the master fuse circuit 210 of FIG. 16 according to another example embodiment of the present invention.

In the example embodiment of FIG. 17, the master fuse circuit 210 may include PMOS transistor PM17, NMOS transistors NM171/NM172 and inverter INV17. If the power-up bar signal VCCHB is applied at the first logic level and the master fuse MF is cut, the NMOS transistor NM171 may be turned on. An operation enable signal ENB of inverter INV17 may transition to the first logic level and an operation enable signal EN may transition to the second logic level. If the power-up bar signal VCCHB transitions to the second logic level, the NMOS transistor NM171 may be turned off and the output EN may be maintained at the second logic level (e.g., by a transition to the first logic level of the NMOS transistor NM172). Thus, the power-up bar signal VCCHB and the operation enable signal EN may be maintained at the second logic level.

In the example embodiment of FIG. 16, control fuse circuits 311-317 may be controlled based on an operation enable signal (e.g., EN, ENB, etc.) of the master fuse circuit 210, and may include a plurality of control fuses AF which may generate first to Mth control signal pairs (e.g., M being a natural number greater than or equal to 2) as status signals that may indicate an operating status cutting of the control fuses (e.g., whether a given control fuse is cut or non-cut) based on memory cell defect information. In an example, a given number of control fuses AF may correspond to the bit number of an address signal (e.g., an internal address signal, an external address signal, etc.).

Figure 18:
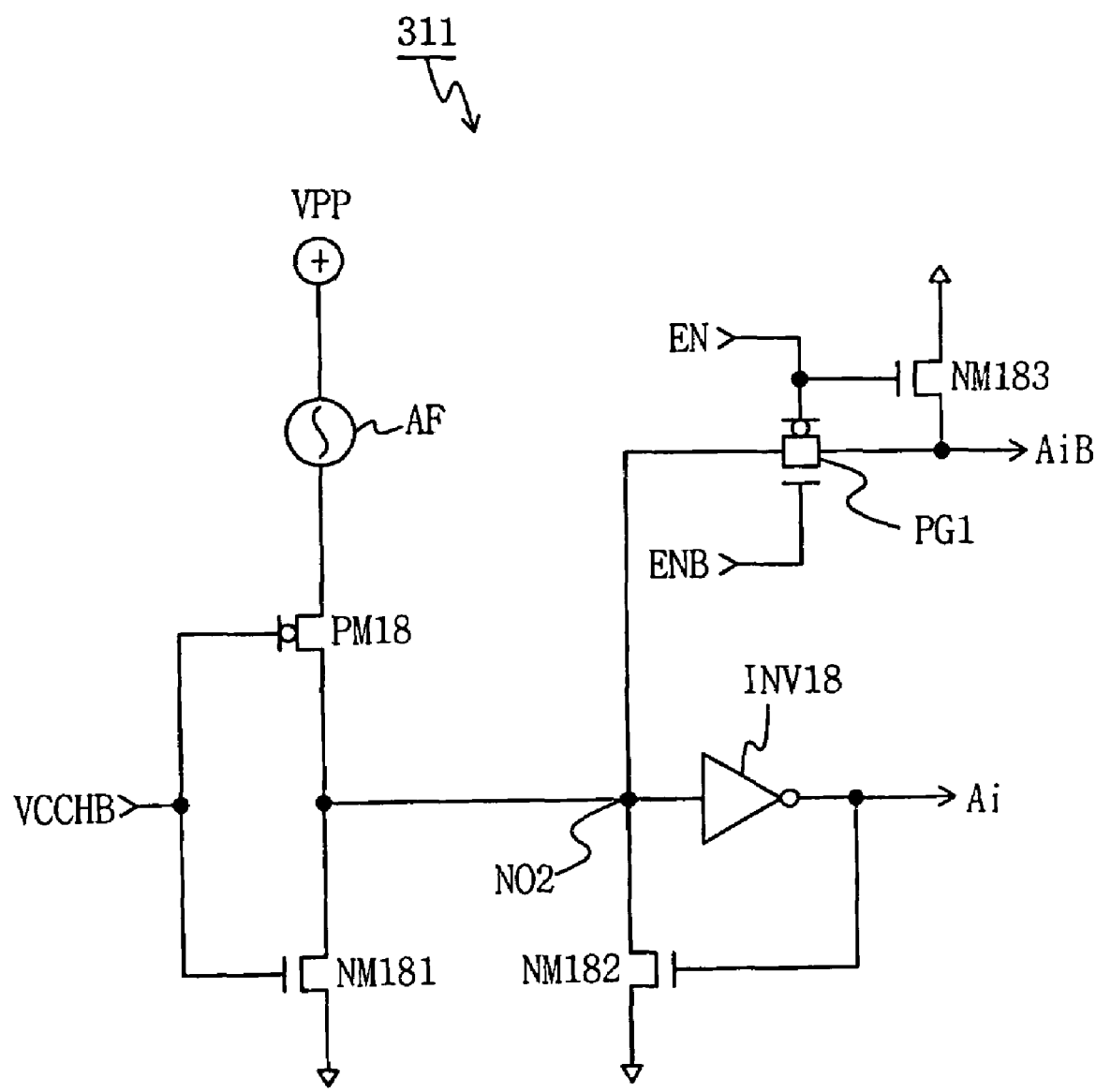
FIG. 18 is a circuit diagram illustrating a control fuse circuit according to another example embodiment of the present invention.

FIG. 18 is a circuit diagram illustrating the control fuse circuit 311 of FIG. 16 according to another example embodiment of the present invention.

In the example embodiment of FIG. 18, if the power-up bar signal VCCHB is applied at the first logic level and the control fuse AF is cut, NMOS transistor NM181 may be turned on. An output Ai of inverter INV18 may transition to the first logic level, and an output AiB from a pass gate PG1 may transition to the second logic level. If the power-up bar signal VCCHB transitions to the second logic level, the NMOS transistor NM181 may be turned off and a node NO2 may be maintained at the second logic level (e.g., based on an on-transition of the NMOS transistor NM182). Thus, the power-up bar signal VCCHB and the control signal AiB may be maintained at the second logic level and the control signal pair Ai may be maintained at the first logic level.

Figure 19:
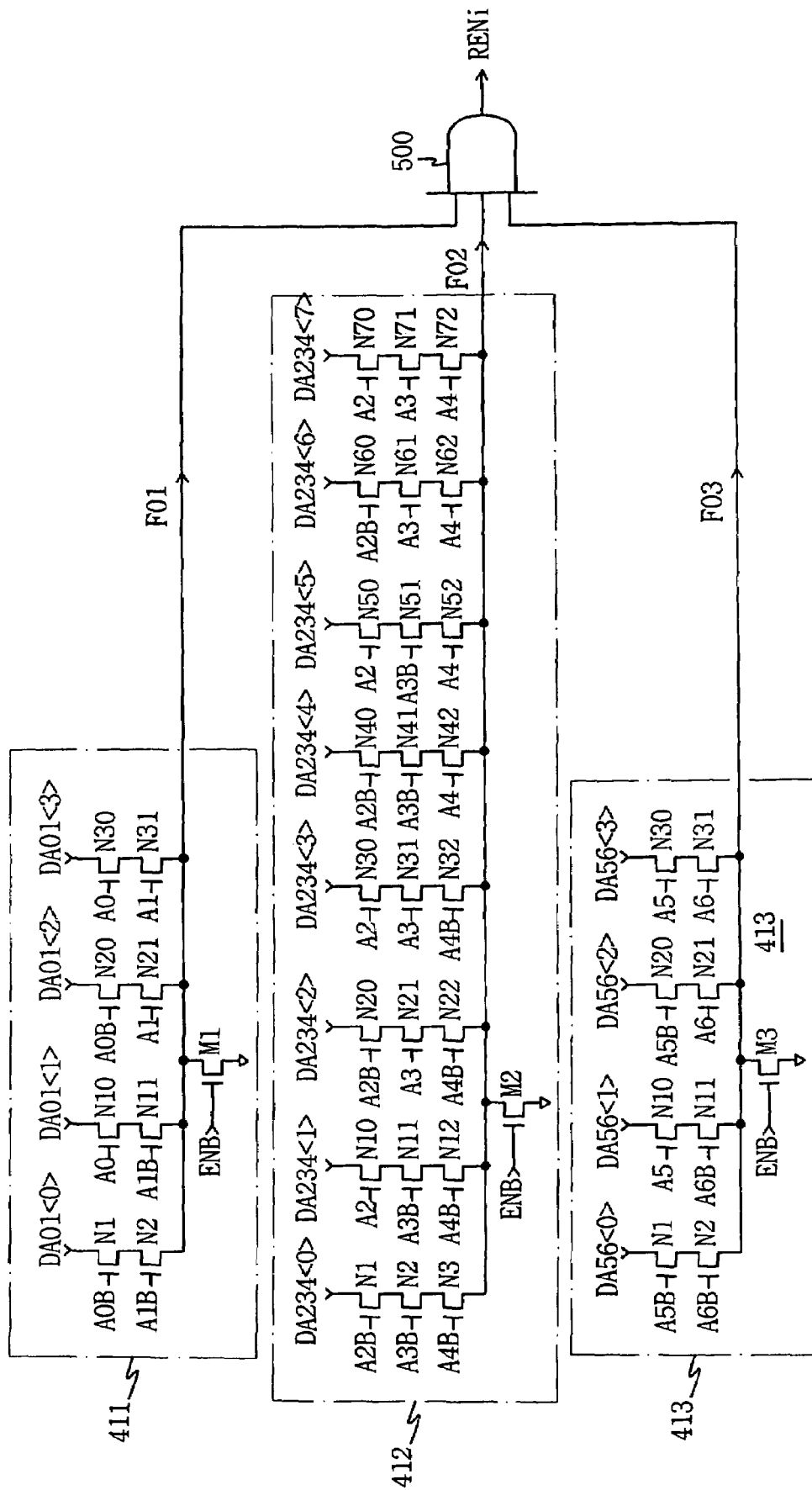
FIG. 19 is a circuit diagram illustrating first, second and third decoders and a combination circuit according to another example embodiment of the present invention.

FIG. 19 is a circuit diagram illustrating the first, second and third decoders 411/412/413 and the combination circuit 500 of FIG. 16 according to another example embodiment of the present invention.

In the example embodiment of FIG. 19, first, second and third decoders 411/412/413 (e.g., which may include at least one NMOS transistor) may each output a given bit at a given logic level (e.g., the first logic level, the second logic level, etc.) from among decoding address signal bits each applied in a unit of 2m bit, to the program output terminals FO1, FO2, FO3, in response to combinational logic inputs of corresponding control signal pairs among the first to Mth control signal pairs.

In the example embodiment of FIG. 19, the first decoder 411 may include unit decoders DA01<0>-DA01<3> which may perform a redundancy decoding of a 4 bit decoding address. Each of the unit decoders may include NMOS transistors (e.g., NMOS transistors N1 and N2 in DA01<0>, etc.), whose channels may be connected in series and may be controlled by a combinational logic input (e.g., a 2 bit combinational logic input).

In the example embodiment of FIG. 19, the second decoder 412 may include unit decoders da234<0>-DA234<7> which may perform a redundancy decoding of an 8 bit decoding address. Each of the unit decoders may include NMOS transistors (e.g., NMOS transistors N1, N2 and N3 in DA234<0>), whose channels may be connected in series and may be controlled by a combinational logic input (e.g., a 3 bit combinational logic input).

In the example embodiment of FIG. 19, the third decoder 413 may be constructed and function similarly to the first decoder 411 (described above).

In the example embodiment of FIG. 19, the combination circuit 500 may be the AND gate 500 and may perform an AND operation on signals received from the program output terminals FO1/FO2/FO3, the output of which may be the redundancy enable signal RENi. In other example embodiments, the combination circuit 500 may include other combinational logic structures (e.g., an AND gate, a NOR gate, a NAND gate, etc.).

In the example embodiment of FIG. 19, fuses may not be included in the first/second/third decoders 411/412/413. Further, the first to Mth control signal pairs generated by the memory cell defect information may be include only one fuse per address bit (e.g., internal address bit, external address bit, etc.).

An example of operation will now be described with reference to FIG. 19. In the following example, it may be assumed that an internal or external address may have 7 bits and a redundancy enable address including bits (A6, A5, A4, A3, A2, A1, A0) may correspond to address (1111100), respectively. In the example operation of FIG. 19, control fuses other than control fuses corresponding to address bits A0 and A1 (e.g., the master fuse MF and the control fuses 311 to 317) may be cut. A0B and A1B may be set to the first logic level by the first decoder 411. Address bits A2, A3 and A4 may be set to the first logic level and may be received by the second decoder 412. Address bits A5 and A6 may be set to the first logic level and may be received by the third decoder 413. The address (1111100) may be received from an external source/device and may be decoded at an address decoder to generate decoded addresses DA01<0:3>, DA234<0:7> and DA56<0:3>. The generated decoding address signals may be received as DA01<0:3> at the first logic level (e.g., a higher logic level) at the first decoder 411, DA234<0:7> at the first logic level (e.g., a higher logic level) at the second decoder 412 and DA56<0:3> at the first logic level (e.g., a higher logic level) at the third decoder 413. All remainder decoded address may be at a second logic level (e.g., a lower logic level).

In the above-described example method of FIG. 19, the unit decoder corresponding to the decoding address DA01<0> (e.g., including NMOS transistors N1 and N2) of the first decoder 411 may be turned on or activated in response to the corresponding combination logic levels (e.g., A0B and A1B), and the activated first logic level of the DRA01<0> may be transferred to the program output terminal FO1. In the second decoder 412, the unit decoder corresponding to the decoded address DA234<7> (e.g., including NMOS transistors N70/N71/N72) may be turned on or activated in response to the corresponding combination logic levels (e.g., A2, A3, and A4), and the activated first logic level of the DRA234<7> may be received by the program output terminal FO2. In the third decoder 413, the unit decoder corresponding to the decoded address DA56<3> (e.g., including NMOS transistors N30 and N31) may be turned on or activated in response to the corresponding combination logic levels (e.g., A5 and A6), and the activated first logic level of the DRA56<3> may be transferred to program output terminal FO3.

In the above-described example method of FIG. 19, each of the outputs FO1, FO2 and FO3 may transition to the first logic level. The output signals of the decoders 411/412/413 have may be received by the combination circuit 500. The combination circuit 500 may perform an AND operation on the received signals to generate a redundancy enables signal RENi at the first logic level.

In the example embodiment of FIG. 19, a redundancy operation may be formed by cutting a master fuse MF and control fuses other than fuses associated with the defective address signal bits. The redundancy enable signal RENi may be turned on or activated when a defective address may be applied during normal operation of a semiconductor memory device (e.g., semiconductor device 1100), thereby debugging (e.g., correcting operation) of the semiconductor device.

In another example embodiment of the present invention, instead of a one-to-one ratio between fuses and signal bit of a decoding row address or decoding column address, a redundancy operation may be performed using combinational logic. The redundancy enable signal may thereby be generated at a higher speed. Further, a given number of fuses required may be reduced. Further, a duration allocated to a redundancy operation may be reduced (e.g., because a cutting time for given fuses in the redundancy operation may be reduced).

In another example embodiment of the present invention, a number of fuses used for a redundancy operation may be reduced, which may thereby reduce a chip area for a semiconductor device, which may thereby reduce a repair time for the semiconductor device.

Example embodiments of the present invention being thus described, it will be obvious that the same may be varied in many ways. For example, while logic levels are above-described as transitioning to either the first or second logic level, it is understood that the first or second logic levels may be transitioned to or from either the first or second logic level. In other words, "transition" may not necessarily mean that a previous logic level differed from the logic level transitioned to.

Further, it is understood that the above-described first and second logic levels/states may correspond to a higher level (e.g., a logic "1") and a lower logic level (e.g., a logic "0"), respectively, in an example embodiment of the present invention. Alternatively, the first and second logic levels/states may correspond to the lower logic level and the higher logic level, respectively, in other example embodiments of the present invention.

Further, while above-described example circuits (e.g., row/column spare circuits 10a/11a, etc.) include a given number of fuses, it is understood that other example embodiments of the present invention may include any number of fuses (e.g., based on an internal/external, decoded/undecoded address length).

Further, while the AND gate/combination circuit 500 is above-described and illustrated as an AND gate, it is understood that other example embodiments of the present invention may employ other types of combinational logic (e.g., a NOR gate, a NAND gate, etc.).

Such variations are not to be regarded as departure from the spirit and scope of example embodiments of the present invention, and all such modifications as would be obvious to one skilled in the art are intended to be included within the scope of the following claims.

What is claimed is:

1. A method of reducing the number of fuses used for a redundancy program operation, comprising:
    allocating a first portion of fuses corresponding to signal bits of a decoding address; and
    allocating a second portion of fuses corresponding to signal bits of an internal address.

2. The method of claim 1, wherein the internal address is generated before predecoding an external address.

* * * * *